United States Patent
Seo

(10) Patent No.: US 12,349,349 B2
(45) Date of Patent: Jul. 1, 2025

(54) MEMORY DEVICE, METHOD OF MANUFACTURING MEMORY DEVICE AND METHOD OF OPERATING MEMORY DEVICE

(71) Applicant: SK hynix Inc., Icheon-si (KR)

(72) Inventor: Moon Sik Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 266 days.

(21) Appl. No.: 17/573,338

(22) Filed: Jan. 11, 2022

(65) Prior Publication Data
US 2023/0058213 A1 Feb. 23, 2023

(30) Foreign Application Priority Data
Aug. 18, 2021 (KR) .................. 10-2021-0109023

(51) Int. Cl.
| G11C 16/04 | (2006.01) |
| G11C 16/10 | (2006.01) |
| G11C 16/26 | (2006.01) |
| H10B 43/27 | (2023.01) |

(52) U.S. Cl.
CPC .............. *H10B 43/27* (2023.02); *G11C 16/10* (2013.01); *G11C 16/26* (2013.01)

(58) Field of Classification Search
CPC ................................................ G11C 16/0466
See application file for complete search history.

(56) References Cited

U.S. PATENT DOCUMENTS

| 2013/0087846 | A1* | 4/2013 | Lee ................... H01L 21/32133 |
| | | | 257/E21.09 |
| 2013/0207178 | A1* | 8/2013 | Lee ................... H01L 21/32133 |
| | | | 257/324 |
| 2016/0155750 | A1 | 6/2016 | Yasuda |
| 2021/0066343 | A1* | 3/2021 | Choi ....................... H10B 43/10 |

FOREIGN PATENT DOCUMENTS

| KR | 1020150130103 A | 11/2015 |
| KR | 1020200076464 A | 6/2020 |

* cited by examiner

*Primary Examiner* — Alfredo Bermudez Lozada
(74) *Attorney, Agent, or Firm* — WILLIAM PARK & ASSOCIATES LTD.

(57) ABSTRACT

A memory device, and methods of manufacturing and operating the memory device, include alternately stacked interlayer insulating layers and conductive layers, a vertical hole configured to pass through the alternately stacked conductive layers and interlayer insulating layers, first blocking layers formed along the interlayer insulating layers exposed through the vertical hole, and second blocking layers formed along the conductive layers exposed through the vertical hole, with each second blocking layer having a thickness greater than that of each of the first blocking layers. The memory device also includes charge trap layers formed on the same layer as the interlayer insulating layers, and surrounded by the first and second blocking layers, a tunnel insulating layer formed along inner walls of the second blocking layers and the charge trap layers, and a channel layer formed along an inner wall of the tunnel insulating layer.

20 Claims, 29 Drawing Sheets

MEMORY DEVICE, METHOD OF MANUFACTURING MEMORY DEVICE AND METHOD OF OPERATING MEMORY DEVICE

CROSS-REFERENCE TO RELATED APPLICATION

The present application claims priority under 35 U.S.C. § 119(a) to Korean patent application number 10-2021-0109023, filed on Aug. 18, 2021, in the Korean Intellectual Property Office, the entire disclosure of which is incorporated herein by reference.

BACKGROUND

1. Technical Field

Various embodiments of the present disclosure relate to a memory device, a method of manufacturing the memory device, and a method of operating the memory device, and more particularly, to a structure of a cell string in which data is stored, a method of manufacturing a memory device including the cell string, and a method of operating the memory device.

2. Related Art

A memory system may include a memory device configured to store data, and a controller configured to control the memory device.

The memory device may include a memory block in which data is stored, and peripheral circuits configured to perform a program, read, or erase operation. The memory block may include a plurality of cell strings connected between bit lines and source lines, and the plurality of cell strings may include memory cells capable of storing data. The plurality of memory cells may be programmed, read, or erased according to voltages applied to word lines and bit lines.

As the degree of integration of the memory device increases, the cell strings may be manufactured in a structure including a plurality of memory cells stacked in a vertical direction from a substrate. However, in such a structure, a charge trap layer in which charges are trapped extends between different memory cells. Thus, during the program or read operation, interference between different memory cells may increase.

SUMMARY

Various embodiments of the present disclosure are directed to a memory device capable of suppressing interference between memory cells formed on different layers, a method of manufacturing the memory device, and a method of operating the memory device.

An embodiment of the present disclosure may provide for a memory device including interlayer insulating layers and conductive layers stacked alternately with each other, a vertical hole configured to pass through the alternately stacked conductive layers and interlayer insulating layers, first blocking layers formed along the interlayer insulating layers exposed through the vertical hole, second blocking layers formed along the conductive layers exposed through the vertical hole, wherein each of the second blocking layers has a thickness greater than a thickness of each of the first blocking layers, charge trap layers formed on the same layer as the interlayer insulating layers, and surrounded by the first and second blocking layers, a tunnel insulating layer formed along inner walls of the second blocking layers and the charge trap layers, and a channel layer formed along an inner wall of the tunnel insulating layer.

An embodiment of the present disclosure may provide for a memory device including interlayer insulating layers and word lines stacked alternately with each other, a memory layer configured to pass vertically through the alternately stacked word lines and interlayer insulating layers, and a channel layer formed along an inner wall of the memory layer, wherein the memory layer may include charge trap layers formed on layers different from layers on which the word lines are formed.

An embodiment of the present disclosure may provide for a method of manufacturing a memory device including alternately stacking interlayer insulating layers and sacrificial layers on an underlying structure, forming a vertical hole to pass through the alternately stacked sacrificial layers and interlayer insulating layers, sequentially forming a first blocking layer, a charge trap layer, a tunnel insulating layer, and a channel layer along an inner wall of the vertical hole, removing the sacrificial layers, selectively removing the first blocking layer exposed through an area defined by removing each of the sacrificial layers, forming second blocking layers by oxidizing the charge trap layer exposed through an area defined by selectively removing the first blocking layers, and forming conductive layers between the interlayer insulating layers.

An embodiment of the present disclosure may provide for a method of operating a memory device including, in a program operation of the memory device configured such that word lines and memory cells corresponding to the word lines, respectively, are formed on different layers, applying a program voltage to a selected word line, applying a first pass voltage to a first adjacent word line adjacent to the selected word line in a first direction, applying a second pass voltage, lower than the first pass voltage, to a second adjacent word line adjacent to the selected word line in a second direction, and applying the second pass voltage to unselected word lines.

An embodiment of the present disclosure may provide for a method of operating a memory device including, in a program operation of the memory device configured such that word lines and memory cells corresponding to the word lines, respectively, are formed on different layers, applying a program voltage to a selected word line, applying a first pass voltage to a first adjacent word line adjacent to the selected word line in a first direction, applying a second pass voltage, higher than the first pass voltage, to a second adjacent word line adjacent to the selected word line in a second direction, and applying the second pass voltage or a third pass voltage lower than the second pass voltage to unselected word lines.

An embodiment of the present disclosure may provide for a method of operating a memory device including, in a read operation of the memory device configured such that word lines and memory cells corresponding to the word lines, respectively, are formed on different layers, applying a read voltage to a selected word line, applying a first pass voltage to a first adjacent word line adjacent to the selected word line in a first direction, applying a second pass voltage, higher than the first pass voltage, to a second adjacent word line adjacent to the selected word line in a second direction, and applying the second pass voltage to unselected word lines.

An embodiment of the present disclosure may provide for a method of operating a memory device including, in a read operation of the memory device configured such that word lines and memory cells corresponding to the word lines, respectively, are formed on different layers, applying a read voltage to a selected word line, applying the read voltage to a first adjacent word line adjacent to the selected word line in a first direction, applying a pass voltage to a second adjacent word line adjacent to the selected word line in a second direction, and applying the pass voltage to unselected word lines.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1:
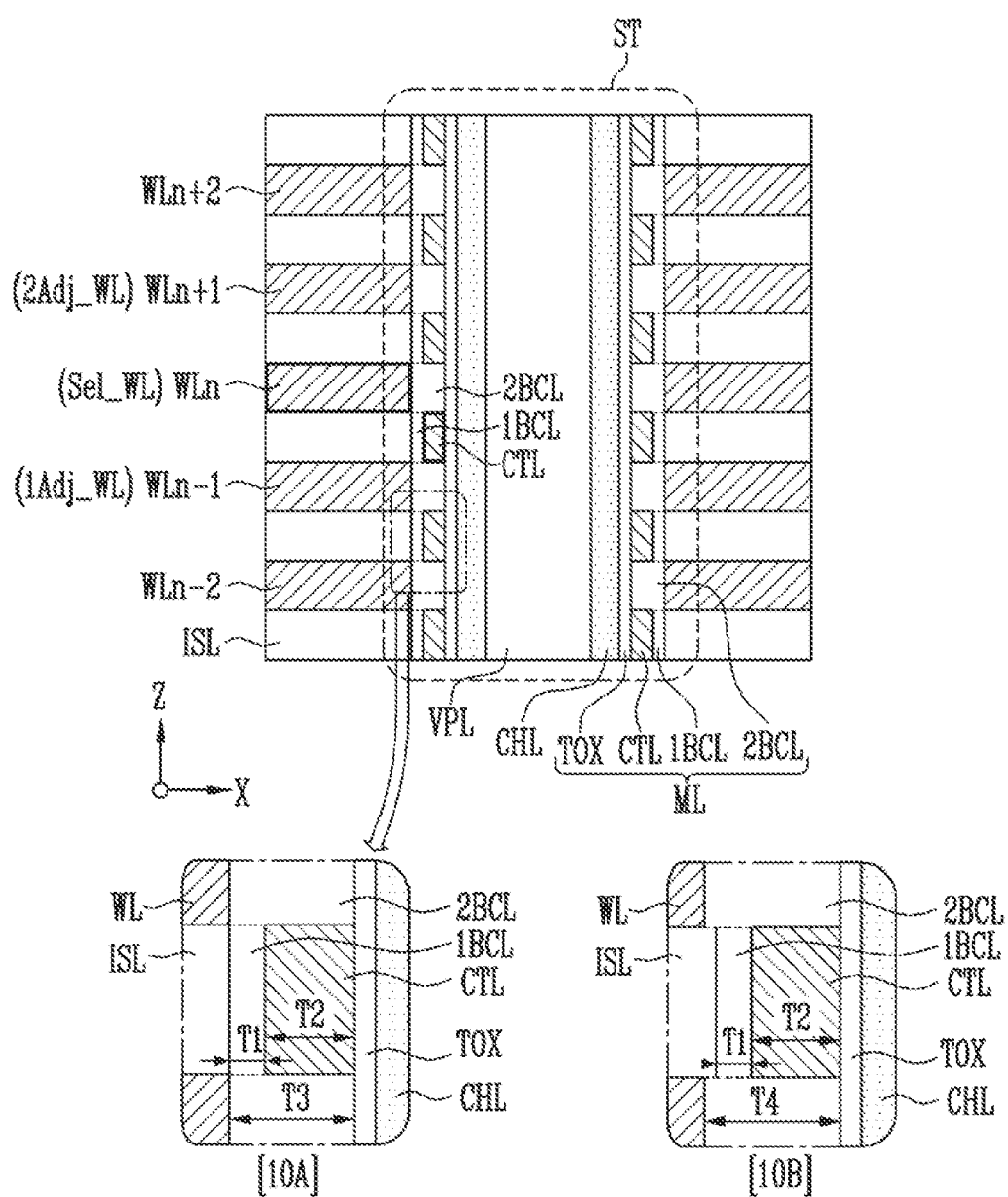
FIG. 1 is a sectional view illustrating the structure of a cell string in accordance with an embodiment of the present disclosure.

FIG. 1 is a sectional view illustrating the structure of a cell string in accordance with an embodiment of the present disclosure.

Referring to FIG. 1, the cell string ST in accordance with an embodiment may include a plurality of memory cells and a plurality of word lines WLn−2, WLn−1, WLn, WLn+1, and WLn+2, which are stacked in a Z direction. The plurality of memory cells may correspond to charge trap layers CTL formed on different layers, respectively. The charge trap layers CTL may be formed on layers different from those of the plurality of word lines WLn−2, WLn−1, WLn, WLn+1, and WLn+2. Interlayer insulating layers ISL may be formed between the plurality of word lines WLn−2, WLn−1, WLn, WLn+1, and WLn+2. The cell string ST may be formed to pass vertically through the plurality of word lines WLn−2, WLn−1, WLn, WLn+1, and WLn+2, and the interlayer insulating layers ISL.

The cell string ST may include a memory layer ML, a channel layer CHL, and a vertical pillar VPL. The vertical pillar VPL may be formed in a cylindrical shape, the channel layer VPL may be formed in a cylindrical shape surrounding the side surface of the vertical pillar VPL, and the memory layer ML may be formed in a cylindrical shape surrounding the side surface of the channel layer CHL. For instance, a vertical hole may be formed to pass vertically through the plurality of word lines WLn−2, WLn−1, WLn, WLn+1, WLn+2 and the interlayer insulating layers ISL, the memory layer ML may be formed along the side surface of the vertical hole, the channel layer CHL may be formed along the inner wall of the memory layer ML, and the vertical pillar VPL may be filled in an internal area surrounded by the channel layer CHL.

The vertical pillar VPL may be formed of an insulating layer, e.g., an oxide layer or a silicon oxide layer.

The channel layer CHL may be formed to provide a path through which electrons or holes move. The channel layer CHL may be formed of a conductive layer or a metal layer. For instance, the channel layer CHL may be formed of a polysilicon layer.

The memory layer ML may include a first blocking layer 1BCL, a charge trap layer CTL, a second blocking layer 2BCL, and a tunnel insulating layer TOX.

The first blocking layer 1BCL may be formed to prevent the transfer of electrons between the charge trap layer CTL and the plurality of word lines WLn−2, WLn−1, WLn, WLn+1, and WLn+2. The first blocking layer 1BCL may be formed as an oxide layer contacting the interlayer insulating layer ISL on the same layer as the interlayer insulating layers ISL. The first blocking layers 1BCL may be formed to be spaced apart from each other by layers on which the plurality of word lines WLn−2, WLn−1, WLn, WLn+1, and WLn+2 are formed. In other words, the first blocking layer 1BCL is formed on layers for which the interlayer insulating layer ISL is formed, and is not formed on layers for which the word lines WLn−2, WLn−1, WLn, WLn+1, and WLn+2 are formed.

The charge trap layer CTL may be formed to trap electrons during the program operation. The charge trap layer CTL may be formed of a nitride layer contacting the first blocking layer 1BCL on the same layer as the first blocking layer 1BCL. The charge trap layers CTL may be formed to be spaced apart from each other by layers on which the plurality of word lines WLn−2, WLn−1, WLn, WLn+1, and WLn+2 are formed. In other words, the charge trap layer CTL is formed on the layer on which the interlayer insulating layer ISL is formed, and is not formed on the layer on which each of the word lines WLn−2, WLn−1, WLn, WLn+1, and WLn+2 is formed.

The second blocking layer 2BCL may be formed to prevent the transfer of electrons between the plurality of word lines WLn−2, WLn−1, WLn, WLn+1, and WLn+2 and the channel layer CHL, and to prevent the transfer of electrons between the plurality of word lines WLn−2, WLn−1, WLn, WLn+1, and WLn+2 and the charge trap layer CTL. The second blocking layers 2BCL may be formed on the same layers as the plurality of word lines WLn−2, WLn−1, WLn, WLn+1, and WLn+2, and are not formed on the layers on which the interlayer insulating layers ISL are formed. The second blocking layer 2BCL may be formed of an Insulating layer, for example, an oxide layer. The charge trap layer CTL and the first blocking layer 1BCL may be formed above and below the second blocking layer 2BCL, and each of the word lines WLn−2, WLn−1, WLn, WLn+1, and WLn+2 and the channel layer CHL may be formed on the side surface of the second blocking layer. In other words, the second blocking layer 2BCL may be surrounded by the charge trap layers CTL and the first blocking layers 1BCL formed on different layers, the word line WLn−2, WLn−1, WLn, WLn+1 or WLn+2, and the tunnel insulating layer TOX.

The thickness of the second blocking layer 2BCL may be equal to (see 10A in FIG. 1) or greater than (see 10B in FIG. 1) the sum of the thickness of the first blocking layer 1BCL and the thickness of the charge trap layer CTL.

In a case where the thickness of the second blocking layer 2BCL is equal to (see 10A in FIG. 1) the sum of the thickness of the first blocking layer 1BCL and the thickness of the charge trap layer CTL, the first blocking layer 1BCL may be formed to have a first thickness T1 from the interlayer insulating layer ISL, and the charge trap layer CTL may be formed to have a second thickness T2 from the first blocking layer 1BCL. In this case, the second blocking layer 2BCL may be formed to have a third thickness that is equal to a distance between the word line WL and the tunnel insulating layer TOX.

In a case where the thickness of the second blocking layer 2BCL is greater than (see 10B in FIG. 1) the sum of the thickness of the first blocking layer 1BCL and the thickness of the charge trap layer CTL, the thickness of the second blocking layer 2BCL may increase as the time of an oxidation process for forming the second blocking layer 2BCL increases. Therefore, the second blocking layer 2BCL may be formed to have a fourth thickness T4 that is greater than the sum of the first thickness T1 and the second thickness T2.

The tunnel insulating layer TOX may be formed to suppress the transfer of electrons between the charge trap layer CTL and the channel layer CHL. The tunnel insulating layer TOX may be formed of an insulating layer, for example, an oxide layer. The tunnel insulating layer TOX may be formed in a cylindrical shape extending in the Z direction. The charge trap layer CTL and the second blocking layer 2BCL formed on different layers may contact an outer wall of the tunnel insulating layer TOX. During the program or erase operation, electrons may tunnel to the charge trap layer CTL or the channel layer CHL through the tunnel insulating layer TOX.

As described above, since the charge trap layer CTL and the plurality of word lines WLn−2, WLn−1, WLn, WLn+1, and WLn+2 are formed on different layers in the cell string ST in accordance with an embodiment, the charge trap layer CTL formed on an upper layer or a lower layer based on one word line may be a memory cell. In an embodiment shown in FIG. 1, the memory cell connected to an n-th word line WLn may be defined as the charge trap layer CTL formed in a layer between n−1-th and n-th word lines WLn−1 and WLn. Alternatively, the charge trap layer CTL formed in a layer between n-th and n+1-th word lines WLn and WLn+1 may be set as the memory cell connected to the n-th word line WLn.

The memory cell corresponding to the word line may be changed according to a voltage applied to the word lines during the program or read operation. For instance, in a case where the n-th word line WLn is a selected word line Sel_WL, the n−1-th word line WLn−1 adjacent to the lower portion of the selected word line Sel_WL may be defined as a first adjacent word line 1Adj_WL, and the n+1-th word line WLn+1 adjacent to the upper portion of the selected word line Sel_WL may be defined as a second adjacent word line 2Adj_WL. During the program or read operation, word lines other than the selected word line Sel_WL are unselected word lines, so the first and second adjacent word lines 1Adj_WL and 2Adj_WL may also be included in the unselected word line. During the program or read operation, a program or read voltage is applied to the selected word line Sel_WL, but a voltage applied to the first and second adjacent word lines 1Adj_WL and 2Adj_WL may be changed according to the position of the selected memory cell corresponding to the selected word line Sel_WL. For example, in a case where the charge trap layer CTL formed on a layer between the selected word line Sel_WL and the first adjacent word line 1Adj_WL is set to the selected memory cell, the selected memory cell may be programmed or read by coupling by voltages applied to the selected word line Sel_WL and the first adjacent word line 1Adj_WL.

Figure 2:
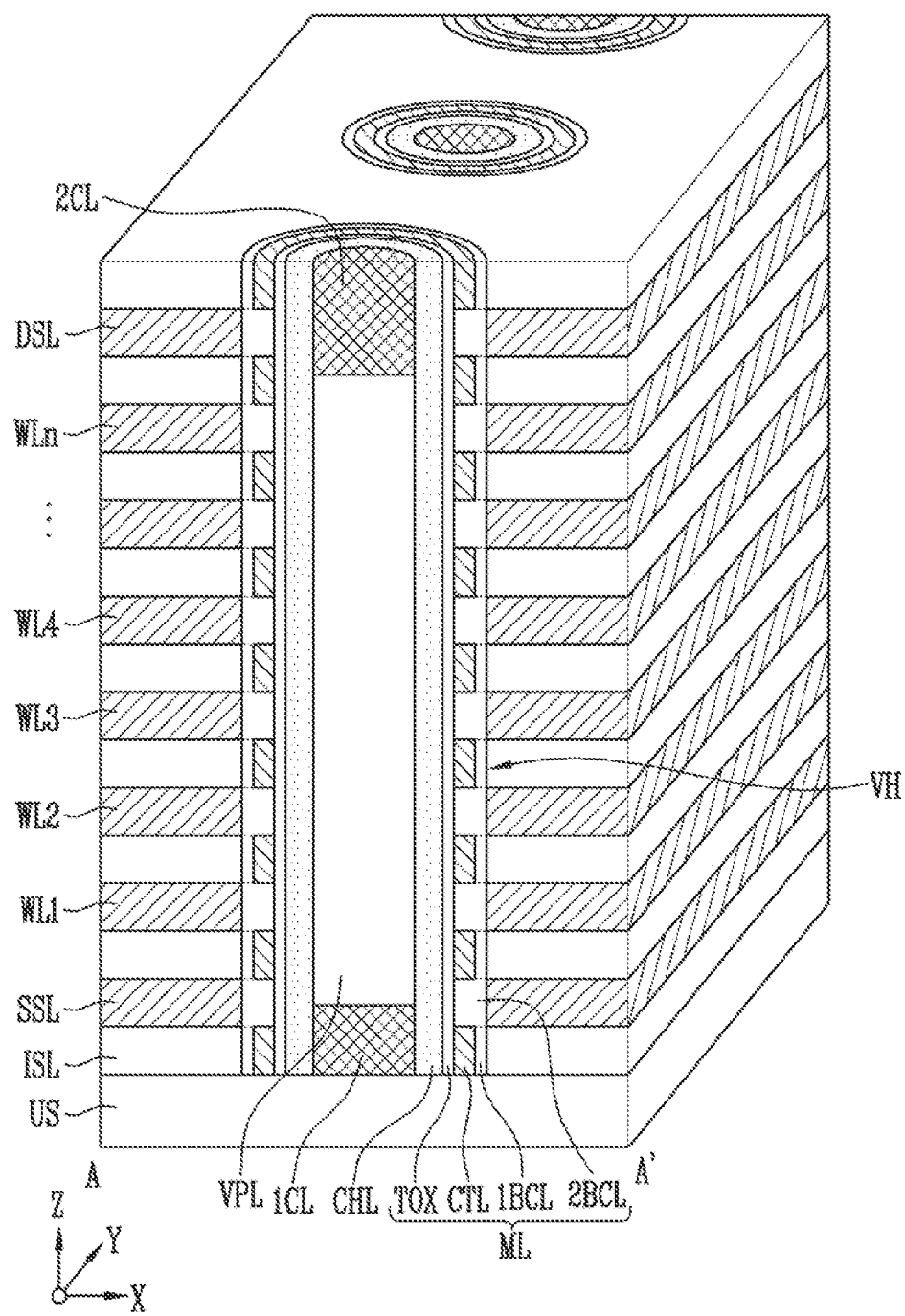
FIG. 2 is a perspective view illustrating the structure of a memory block in accordance with an embodiment of the present disclosure.

FIG. 2 is a perspective view illustrating the structure of a memory block in accordance with an embodiment of the present disclosure.

Referring to FIG. 2, a source select line SSL, first to n-th word lines WL1 to WLn, and a drain select line DSL may be stacked on an underlying structure US to be spaced apart from each other. Interlayer insulating layers ISL may be formed between the underlying structure US, the source select line SSL, the first to n-th word lines WL1 to WLn, and the drain select line DSL. The underlying structure US may be a substrate, a peripheral circuit, or a source line. The source select line SSL, the first to n-th word lines WL1 to WLn, and the drain select line DSL may be formed of a conductive layer or a metal layer, and the interlayer insulating layers ISL may be formed of an insulating layer. For example, the first to n-th word lines WL1 to WLn and the drain select line DSL may be formed of at least one layer selected from among tungsten (W), cobalt (Co), nickel (Ni), molybdenum (Mo), silicon (Si), and polysilicon (poly-Si). For example, the interlayer insulating layers ISL may be formed of an oxide layer or a silicon oxide layer.

A vertical hole VH may be formed to pass through the source select line SSL, the first to n-th word lines WL1 to WLn, the drain select line DSL, and the interlayer insulating layers ISL in a vertical direction (Z direction), and a memory layer ML and a vertical pillar VPL may be formed in the vertical hole VH. A first conductive layer 1CL may be further formed in an area adjacent to the source select line SSL in an area in which the vertical pillar VPL is formed, and a second conductive layer 2CL may be further formed in an area adjacent to the drain select line DSL in an area in which the vertical pillar VPL is formed. The first and second conductive layers 1CL and 2CL may be formed of a tungsten or polysilicon layer. The vertical pillar VPL may be formed of insulating material, e.g., an oxide layer or a silicon oxide layer.

The memory layer ML may include a first blocking layer 1BCL, a charge trap layer CTL, a second blocking layer 2BCL, and a tunnel insulating layer TOX. Since the memory layer is formed in the same manner as the memory layer ML described with reference to FIG. 1, a duplicated description thereof will be omitted.

A method of manufacturing a memory device including the memory layer ML according to an embodiment will be sequentially described with reference to a cross-section A-A'.

FIGS. 3A to 3H are diagrams illustrating a method of manufacturing a memory device in accordance with an embodiment of the present disclosure.

Figure 3A:
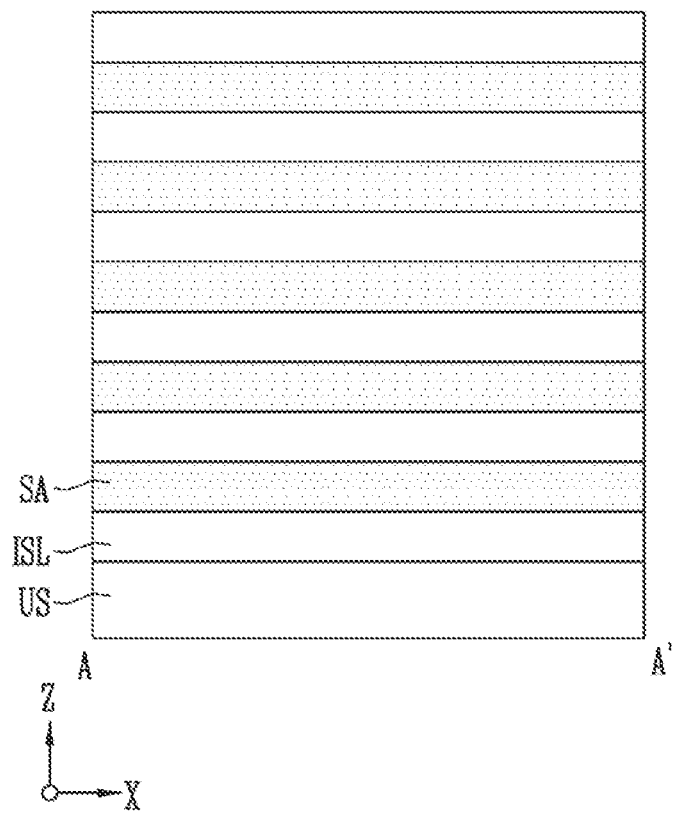
FIGS. 3A to 3H are diagrams illustrating a method of manufacturing a memory device in accordance with an embodiment of the present disclosure.

Referring to FIG. 3A, interlayer insulating layers ISL and sacrificial layers SA may be alternately stacked over an underlying structure US. The underlying structure US may be a substrate, a peripheral circuit, or a source line. Each interlayer insulating layer ISL may be formed of an insulating material such as an oxide layer. The sacrificial layers SA may be formed of material having an etch selectivity different from that of the interlayer insulating layers ISL. For example, each of the sacrificial layers SA may be formed of a nitride layer.

Figure 3B:
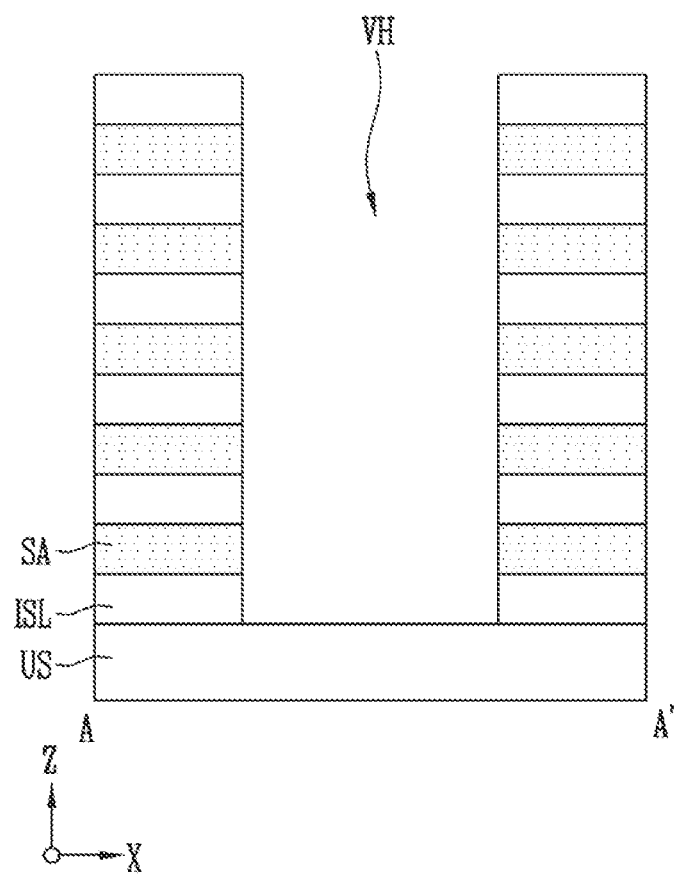

Referring to FIG. 3B, an etching process may be performed to form a vertical hole VH that passes through the interlayer insulating layers ISL and the sacrificial layers SA in a vertical direction. The etching process may be performed by a dry etching process, and may be performed until the underlying structure US is exposed.

Figure 3C:
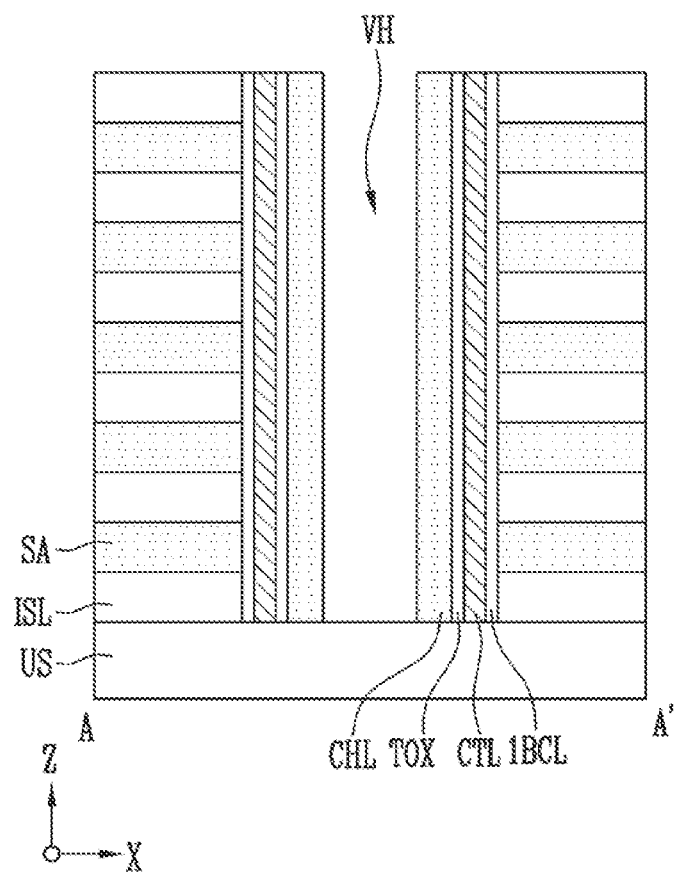

Referring to FIG. 3C, a first blocking layer 1BCL, a charge trap layer CTL, a tunnel insulating layer TOX, and a channel layer CHL may be sequentially formed on a sidewall of the vertical hole VH. For example, a first blocking layer 1BCL having a cylindrical shape may be formed along the sidewall of the vertical hole CH, a charge trap layer CTL having a cylindrical shape may be formed along the inner sidewall of the first blocking layer 1BCL, a tunnel insulating layer TOX having a cylindrical shape may be formed along the inner sidewall of the charge trap layer CTL, and a channel layer CHL may be formed along the inner sidewall of the tunnel insulating layer TOX. The first blocking layer 1BCL may be formed of an oxide layer. The charge trap layer CTL may be formed of a material capable of trapping electrons corresponding to negative charges. For example, the charge trap layer CTL may be formed of a nitride layer. The tunnel insulating layer TOX may be formed of an oxide layer. The channel layer CHL may be formed of a conductive layer through which electrons or holes may move. For instance, the channel layer CHL may be formed of a polysilicon layer.

Figure 3D:
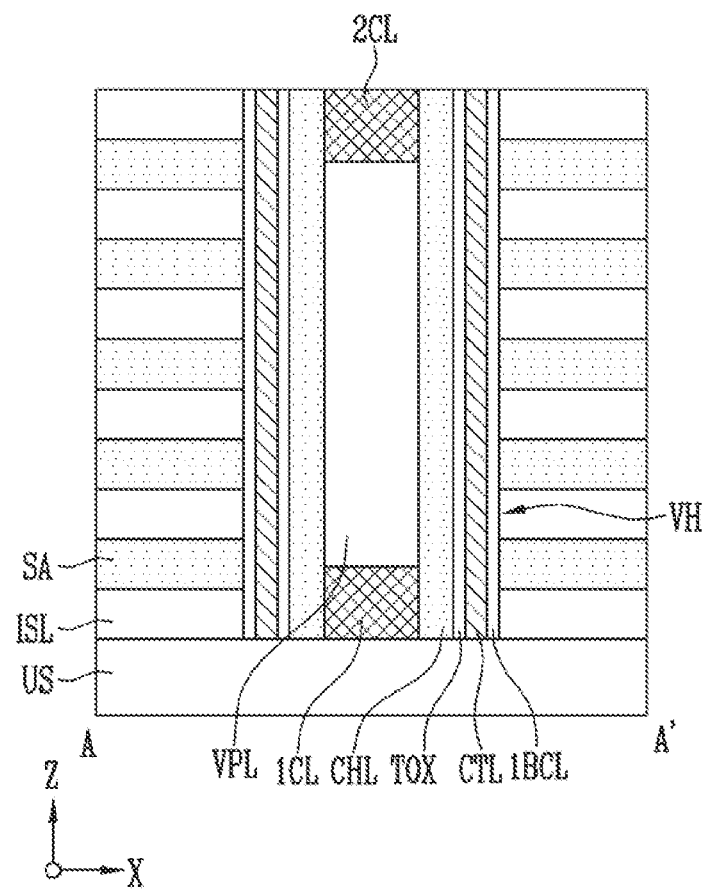

Referring to FIG. 3D, a first conductive layer 1CL, a vertical pillar VPL, and a second conductive layer 2CL may be sequentially formed in the vertical hole VH in which the first blocking layer 1BCL, the charge trap layer CTL, the tunnel insulating layer TOX, and the channel layer CHL are formed. For example, the first conductive layer 1CL, the vertical pillar VPL, and the second conductive layer 2CL may be stacked in the vertical hole VH in which the channel layer CHL is formed. The first and second conductive layers 1CL and 2CL may be formed of a tungsten or polysilicon layer. The vertical pillar VPL may be formed of an oxide layer or a silicon oxide layer.

Figure 3E:
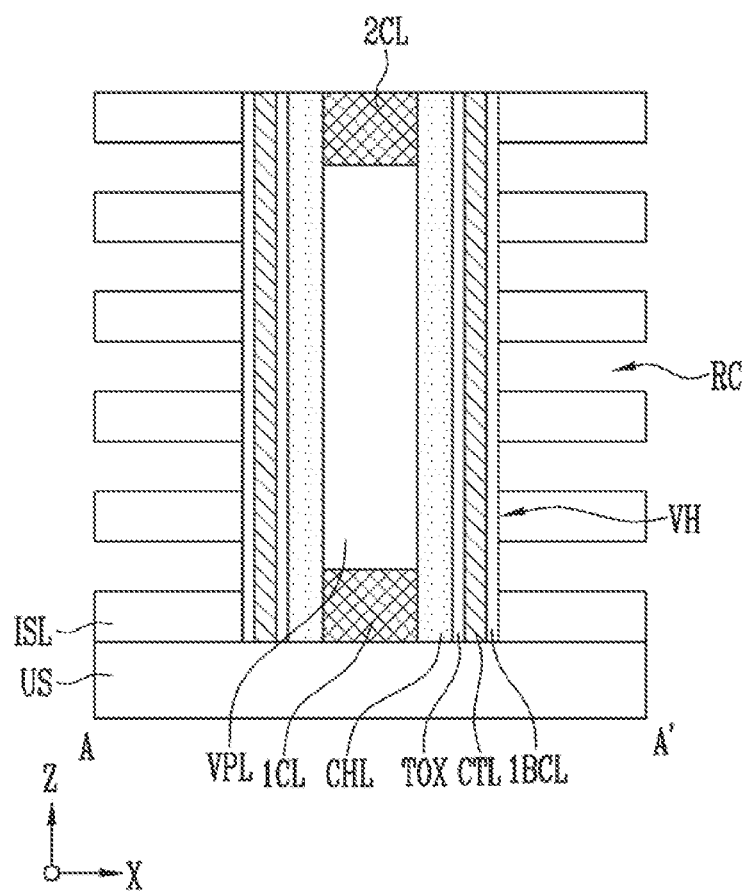

Referring to FIG. 3E, an etching process may be performed to remove the sacrificial layer SA (see FIG. 3D). The etching process may be performed by a wet etching process. Although not shown in FIG. 3E, a trench (not shown) or a slit for exposing a side surface of the sacrificial layer SA formed in each layer may be formed. The sacrificial layer SA contacting an etchant may be removed through the trench or the slit. The first blocking layer 1BCL and the interlayer insulating layers ISL may be exposed through a recess RC that is defined by removing the sacrificial layer SA.

Figure 3F:
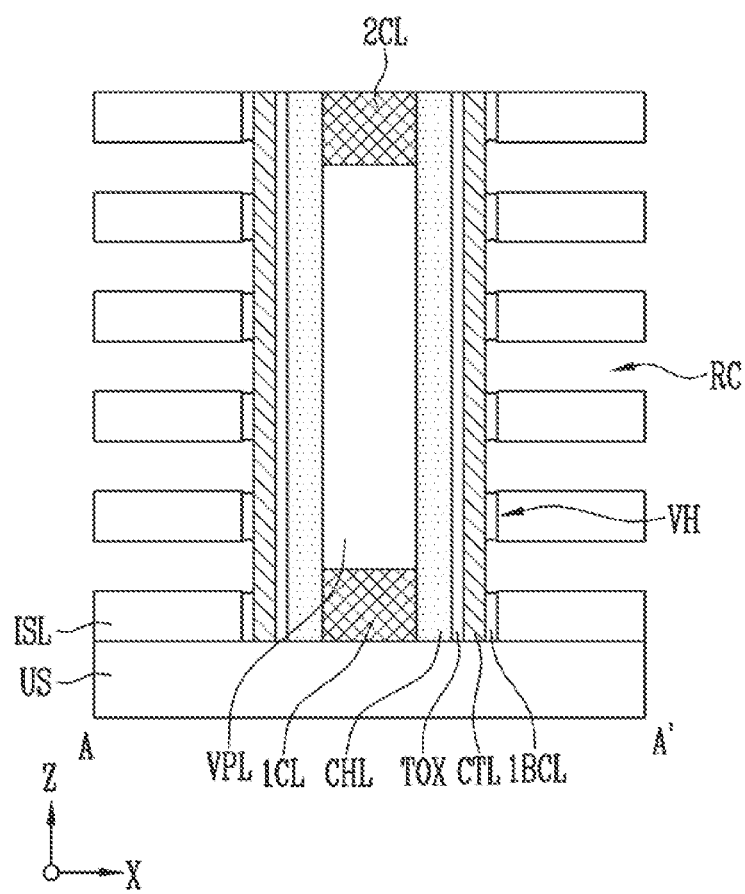

Referring to FIG. 3F, an etching process may be performed to selectively remove the first blocking layer 1BCL exposed through the recess RC. The etching process may be performed using an etchant having the etch selectivity of the first blocking layer 1BCL that is higher than that of the interlayer insulating layer ISL. If the first blocking layer 1BCL between the interlayer insulating layers ISL is removed, the charge trap layer CTL may be exposed.

Figure 3G:
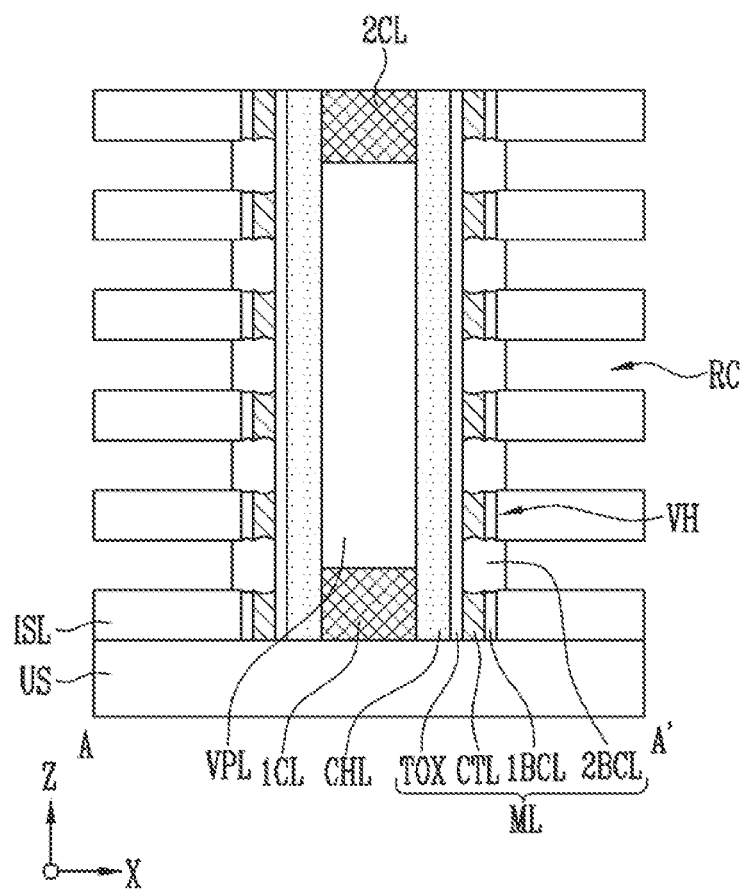
Figure 3H:
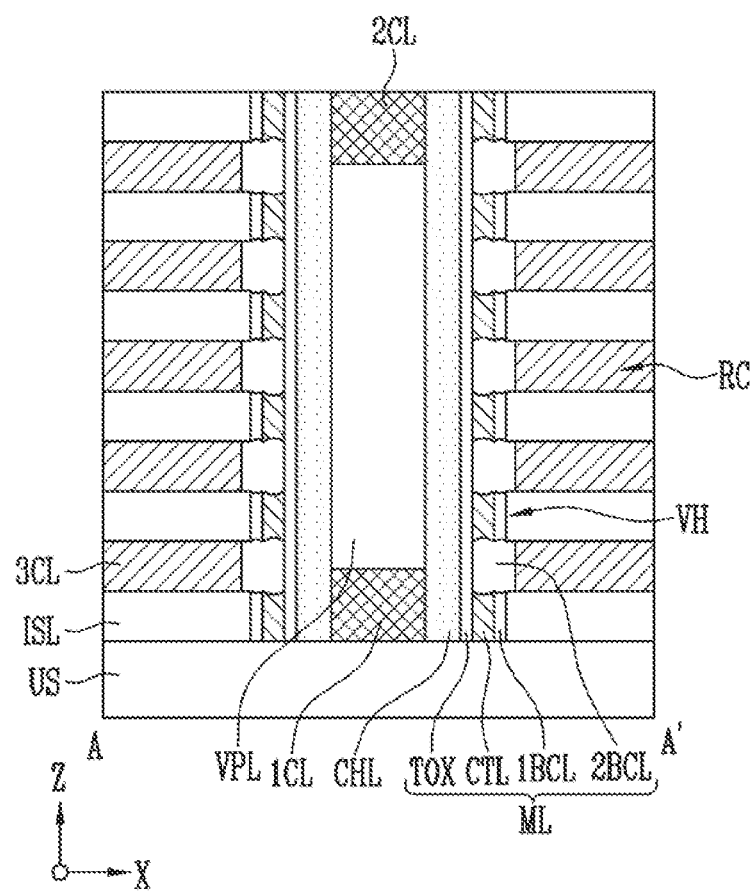

Referring to FIG. 3G, an oxidation process for oxidizing a portion of the charge trap layer CTL exposed through the recess RC may be performed. For example, a portion of the charge trap layer CTL exposed through the recess RC may be oxidized to change into a second blocking layer 2BCL. A portion of the charge trap layer CTL formed on the same layer as the layer on which each of the interlayer insulating layers ISL is formed is not oxidized. Thus, the charge trap layers CTL may be spaced apart from each other through the recesses RC, and may remain in a ring shape in the layer on which each of the interlayer insulating layers ISL is formed. In other words, the charge trap layer CTL is surrounded by the first blocking layer 1BCL, the second blocking layer 2BCL, and the tunnel insulating layer TOX. The charge trap layers are stacked in the vertical direction (Z direction), and remain in the shape of each of the rings that are spaced apart from each other through the recesses RC. By forming the second blocking layer 2BCL, the memory layer ML including the first blocking layer 1BCL, the second blocking layer 2BCL, the charge trap layer CTL, and the tunnel insulating layer TOX may be formed. Referring to FIG. 3H, a third conductive layer 3CL for a word line or a select line may be filled in the recess RC. The third conductive layer 3CL may be formed of a conductive material such as tungsten (W), but the third conductive layer 3CL is not limited to tungsten. For example, the third conductive layer 3CL may be formed of at least one layer selected from among tungsten (W), cobalt (Co), nickel (Ni), molybdenum (Mo), silicon (Si), and polysilicon (poly-Si).

The third conductive layer 3CL filled in the recess RC may be surrounded by the interlayer insulating layers ISL formed above and below the third conductive layer and the second blocking layer 2BCL.

Therefore, a layer in which the third conductive layer 3CL for the word line or the select line is formed is different from a layer in which the charge trap layer CTL is formed. For instance, the third conductive layers 3CL and the charge trap layers CTL may be alternately stacked on different layers to be spaced apart from each other.

In the above-described memory device, the memory cell in which electrons are trapped may be the charge trap layer (CTL), and the word line or the select line corresponding to the memory cell may be the third conductive layer 3CL formed above or below the layer in which the memory cell is formed. Here, the memory cell corresponding to the select line may be used as a select transistor. The selected memory cell corresponding to the selected word line may be determined by voltages applied to the selected word line, an adjacent word line adjacent to the selected word line, and unselected word lines.

A method of operating the memory device in which the selected memory cell corresponding to the selected word line is set as the charge trap layer CTL formed on the lower layer of the selected word line will be described as an embodiment.

Figure 4:
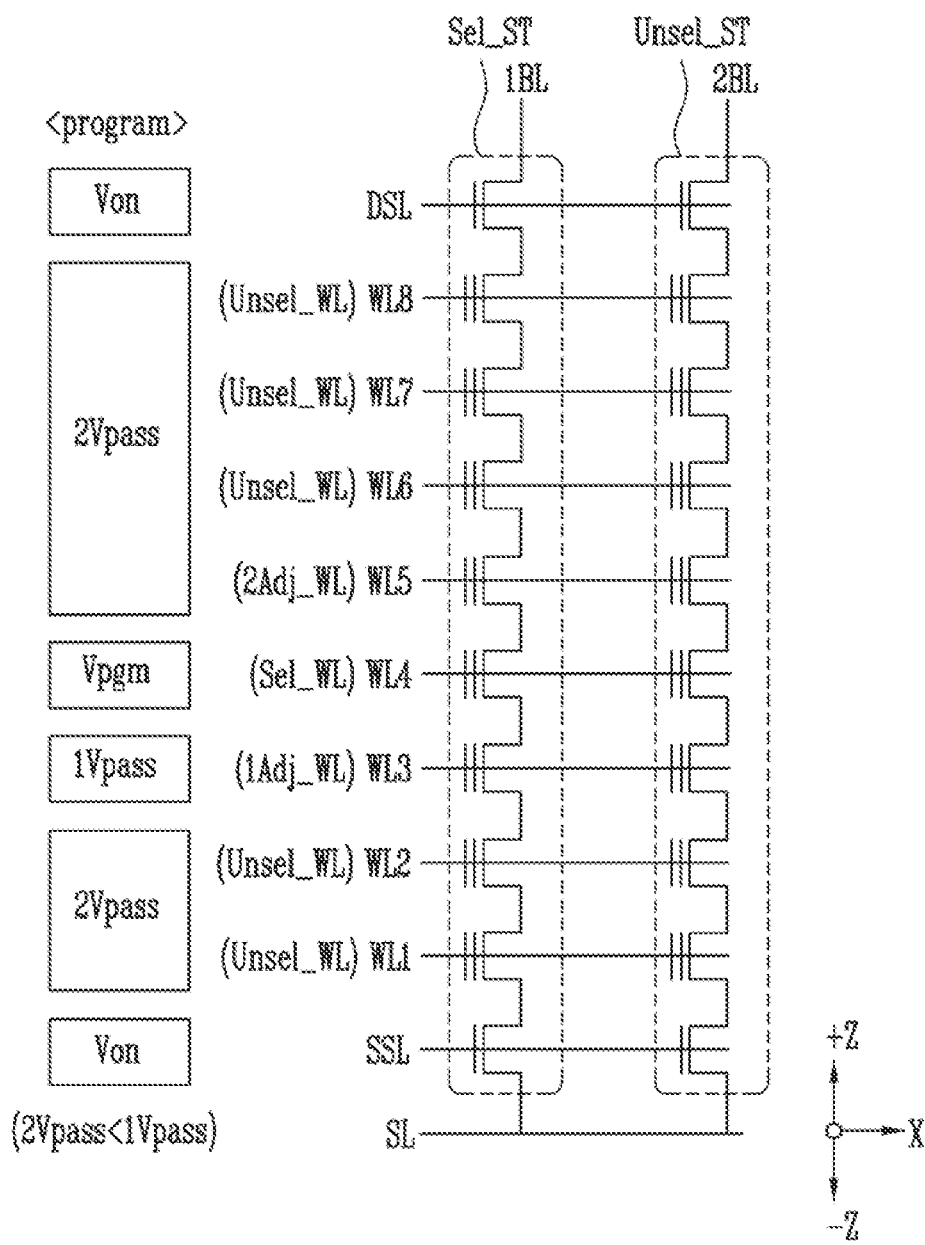
FIG. 4 is a circuit diagram illustrating a program operation in accordance with a first embodiment of the present disclosure.
Figure 5A:
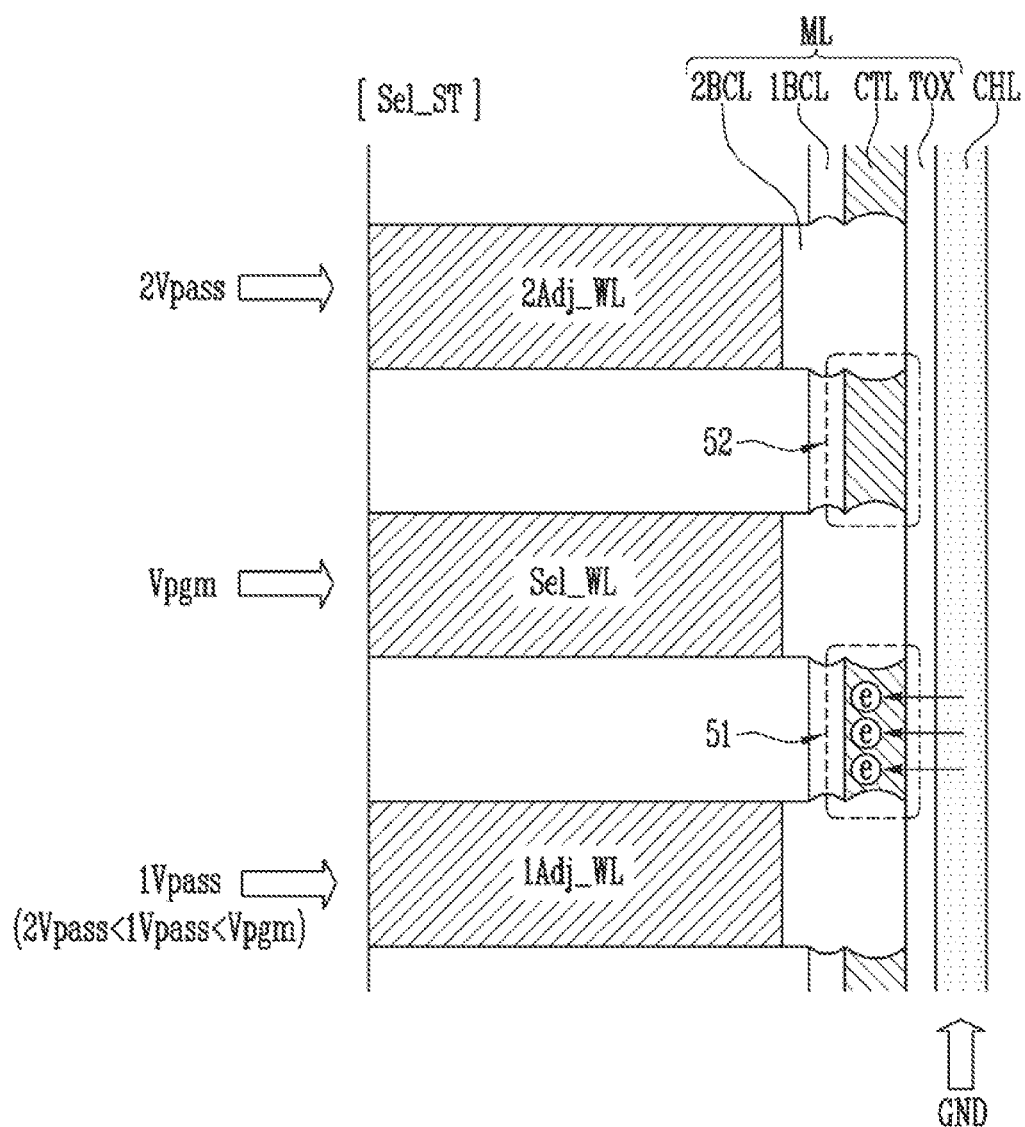
FIGS. 5A and 5B are diagrams illustrating the transfer of electrons during the program operation in accordance with the first embodiment of the present disclosure.
Figure 5B:
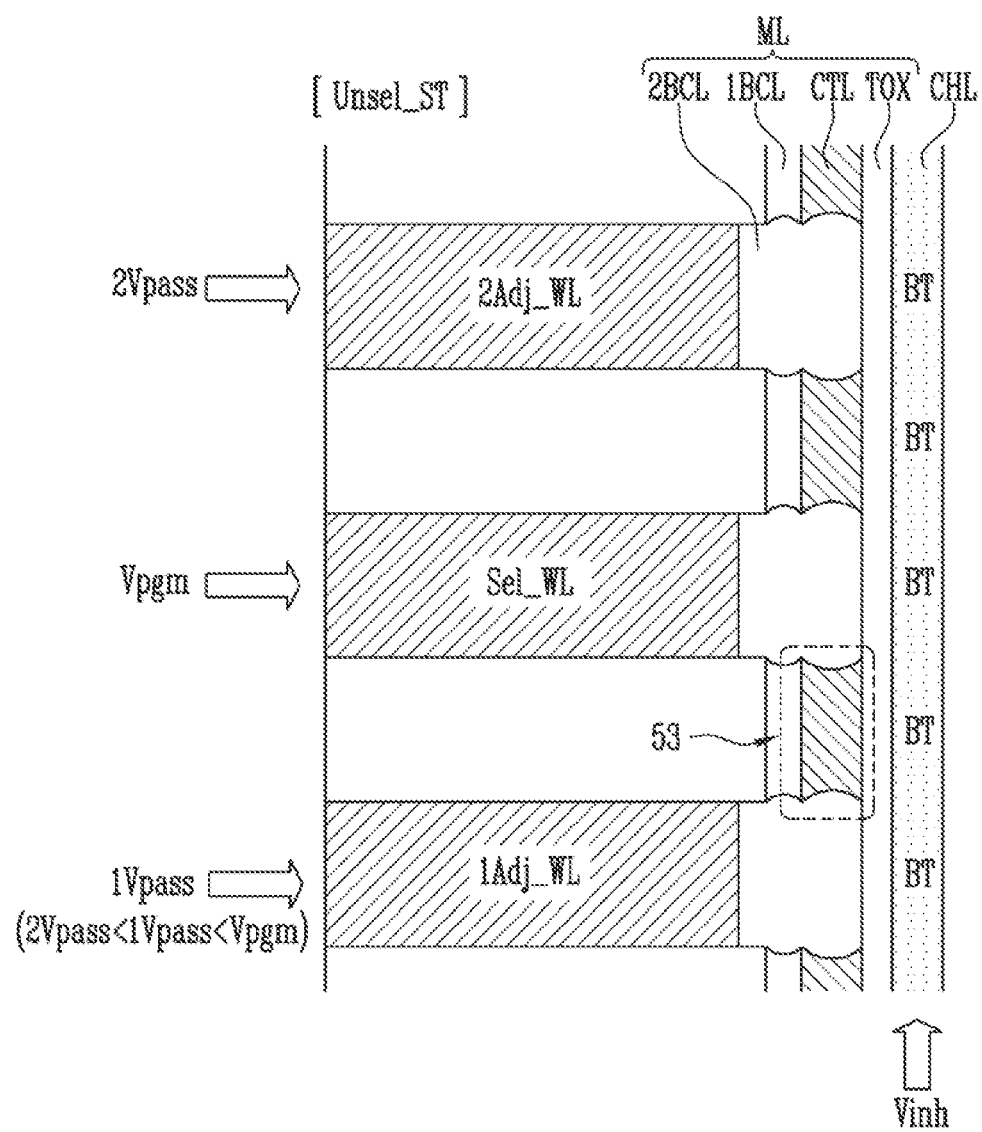

FIG. 4 is a circuit diagram illustrating a program operation in accordance with a first embodiment of the present disclosure, and FIGS. 5A and 5B are diagrams illustrating the transfer of electrons during the program operation in accordance with the first embodiment of the present disclosure.

Referring to FIG. 4, the program operation in accordance with the first embodiment may be performed using Fowler-Nordheim tunneling. During the program operation, a program voltage Vpgm having a positive voltage may be applied to the selected word line Sel_WL, and a first pass voltage 1Vpass may be applied to the first adjacent word line 1Adj_WL adjacent to the lower portion of the selected word line Sel_WL. A second pass voltage 2Vpass lower than the first pass voltage 1Vpass may be applied to the second adjacent word line 2Adj_WL adjacent to the upper portion of the selected word line Sel_WL and the remaining unselected word lines Unsel_WL. Here, the first adjacent word line 1Adj_WL adjacent to the lower portion of the selected word line Sel_WL may be a word line adjacent to the selected word line Sel_WL in a −Z direction, and the second adjacent word line 2Adj_WL adjacent to the upper portion of the selected word line Sel_WL may be a word line adjacent to the selected word line Sel_WL in a +Z direction.

It is assumed that the cell string connected to a first bit line 1BL is a selected cell string Sel_ST, and the cell string connected to a second bit line 2BL is an unselected cell string Unsel_ST. A ground voltage GND may be applied to the source line SL and the first bit line 1BL, and a program inhibit voltage may be applied to the second bit line 2BL. A turn-on voltage Von having a positive voltage may be applied to the drain and source select lines DSL and SSL.

The selected cell string Sel_ST during the program operation will be described below with reference to FIG. 5A, and the unselected cell string Unsel_ST during the program operation will be described below with reference to FIG. 5B.

Referring to FIG. 5A, the ground voltage GND, which is a program allowable voltage, may be applied to the channel layer CHL of the selected cell string Sel_ST. A program voltage Vpgm may be applied to the selected word line Sel_WL, a first pass voltage 1Vpass may be applied to the first adjacent word line 1Adj_WL, and a second pass voltage 2Vpass lower than the first pass voltage 1Vpass may be applied to the second adjacent word line 2Adj_WL.

Since the charge trap layer CTL corresponding to the selected memory cell is positioned in an area between the selected word line Sel_WL and the first adjacent word line 1Adj_WL, a high voltage may be applied to word lines positioned above and below the selected memory cell so as to increase the threshold voltage of the selected memory cell. In other words, since the first pass voltage 1Vpass higher than the second pass voltage 2Vpass is applied to the first adjacent word line 1Adj_WL, high coupling may occur due to the program voltage Vpgm applied to the selected word line Sel_WL and the first pass voltage 1Vpass applied to the first adjacent word line 1Adj_WL. Thus, electrons (e) of the channel layer CHL to which the ground voltage GND is applied may move to the charge trap layer CTL (51) by FN tunneling.

Since high coupling does not occur between the selected word line Sel_WL and the second adjacent word line 2Adj_WL due to the low second pass voltage 2Vpass applied to the second adjacent word line 2Adj_WL, the FN tunneling does not occur in the charge trap layer CTL (52) positioned between the selected word line Sel_WL and the second adjacent word line 2Adj_WL.

Referring to FIG. 5B, since the program prohibit voltage Vinh is applied to the channel layer CHL of the unselected cell string Unsel_ST, boosting BT may occur in the channel layer CHL by the first and second pass voltages 1Vpass and 2Vpass and the program voltage Vpgm. In other words, the voltage of the channel layer CHL may increase due to the boosting BT. Accordingly, since coupling does not occur in the charge trap layer CTL, electrons are not trapped in the charge trap layer CTL (53) positioned between the selected word line Sel_WL and the first adjacent word line 1Adj_WL.

Figure 6:
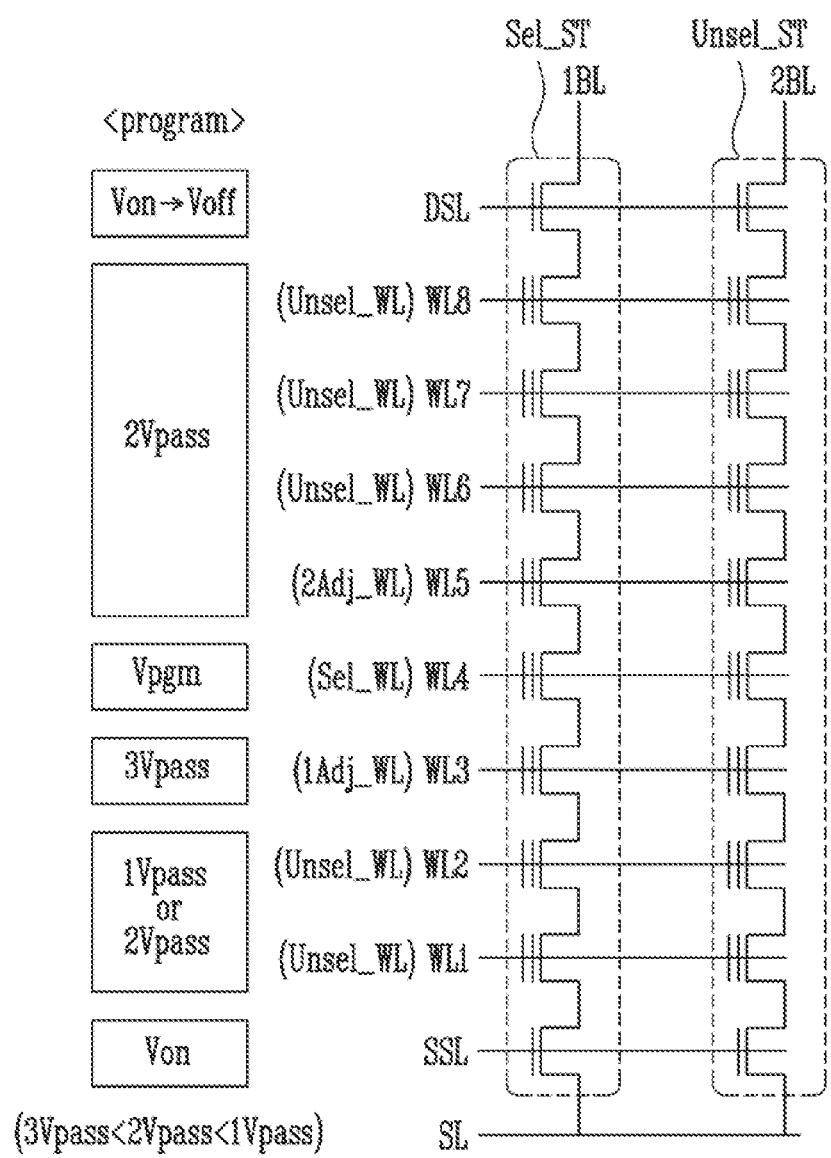
FIG. 6 is a circuit diagram illustrating a program operation in accordance with a second embodiment of the present disclosure.
Figure 7A:
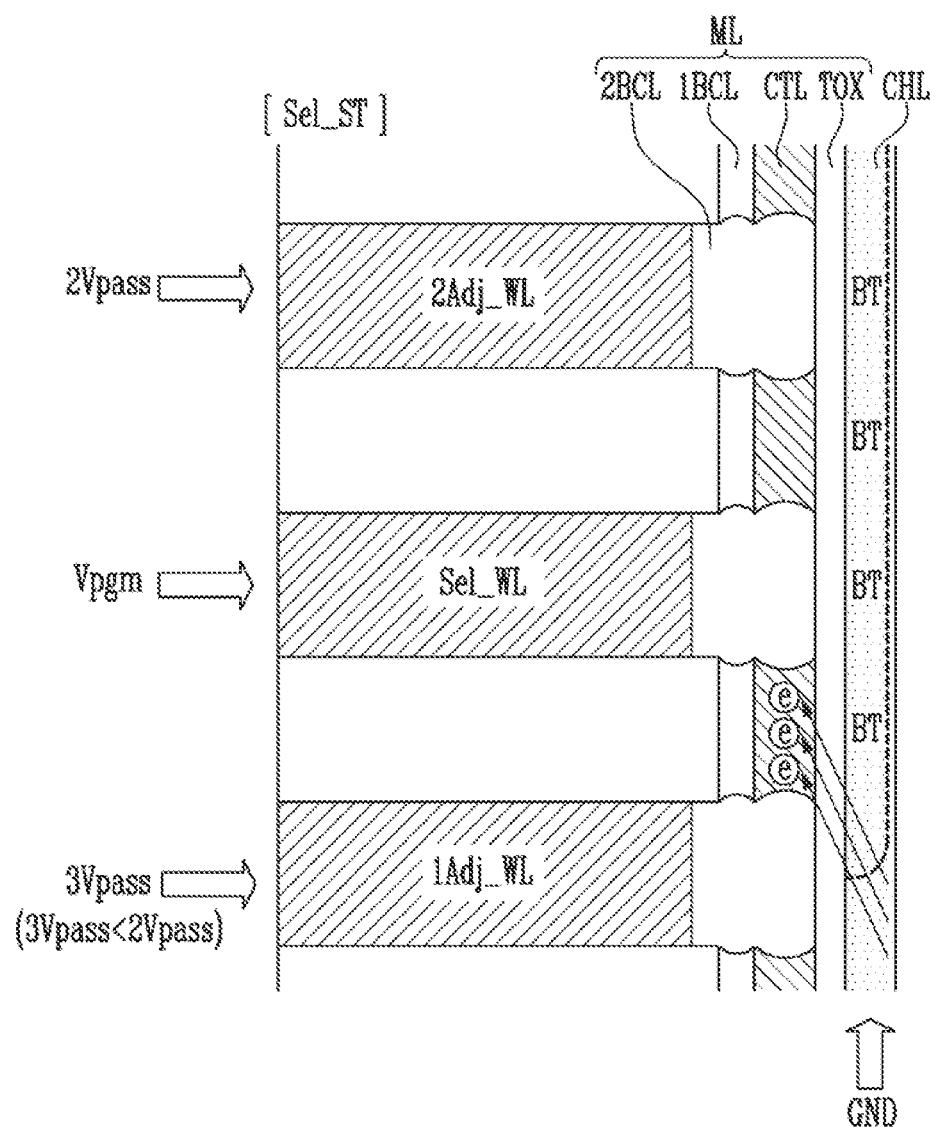
FIGS. 7A and 7B are diagrams illustrating the transfer of electrons during the program operation in accordance with the second embodiment of the present disclosure.
Figure 7B:
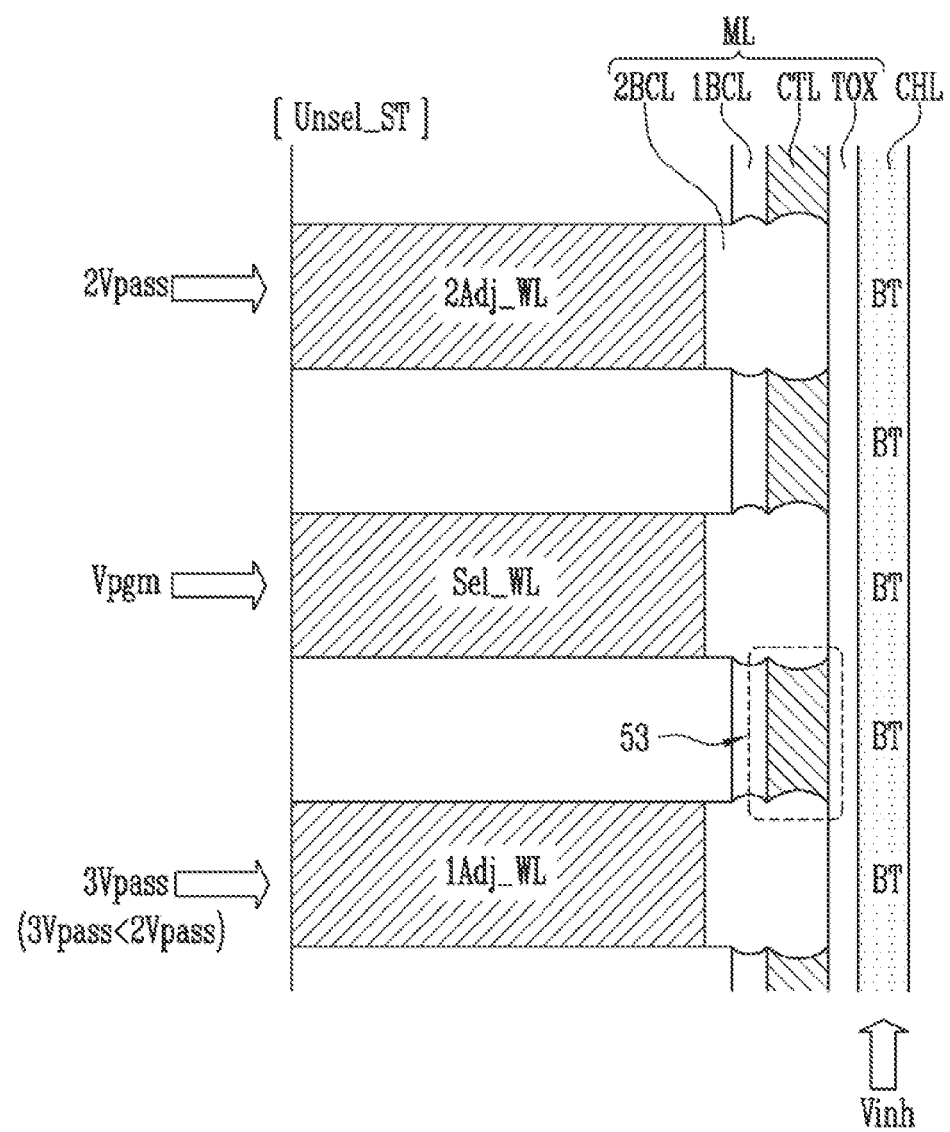

FIG. 6 is a circuit diagram illustrating a program operation in accordance with a second embodiment of the present disclosure, and FIGS. 7A and 7B are diagrams illustrating the transfer of electrons during the program operation in accordance with the second embodiment of the present disclosure.

Referring to FIG. 6, the program operation in accordance with the second embodiment may be performed using hot carrier injection. During the program operation, a program voltage Vpgm having a positive voltage may be applied to the selected word line Sel_WL, and a third pass voltage 3Vpass lower than a second pass voltage 2Vpass may be applied to the first adjacent word line 1Adj_WL adjacent to the lower portion of the selected word line Sel_WL. The third pass voltage 3Vpass may be set to a level where a voltage difference from the program voltage Vpgm is greater than a voltage difference between the second pass voltage 2Vpass and the program voltage Vpgm. For example, the third pass voltage 3Vpass may be set as the ground voltage GND.

A first or second pass voltage 1Vpass or 2Vpass may be applied to the unselected word lines Unsel_WL positioned between the first adjacent word line 1Adj_WL and the source select line SSL. The second pass voltage 2Vpass may be applied to the unselected word lines Unsel_WL positioned between the selected word line Sel_WL and the drain select line DSL.

Before the program voltage Vpgm is applied to the selected word line Sel_WL so that the hot carrier injection occurs in the selected memory cell, a precharge voltage may be applied to the first bit line 1BL, and a turn-on voltage Von may be applied to the drain select line DSL.

Subsequently, when the program voltage Vpgm is applied to the selected word line Sel_WL, a turn-off voltage Voff may be applied to the drain select line DSL to turn off the drain select transistor. The ground voltage GND may be applied to the source line SL, and the turn-on voltage Von may be applied to the source select line SSL.

Therefore, the hot carrier injection may occur between the selected word line Sel_WL and the first adjacent word line 1Adj_WL, and thereby the selected memory cell may be programmed.

The selected cell string Sel_ST during the program operation will be described below with reference to FIG. 7A, and the unselected cell string Unsel_ST during the program operation will be described below with reference to FIG. 7B.

Referring to FIG. 7A, a positive voltage may be applied to the upper area (+Z direction) of the selected word line Sel_WL in the channel layer CHL of the selected cell string Sel_ST due to the boosting BT, and a program allowable voltage may be applied to the lower are (−Z direction) of the first adjacent word line 1Adj_WL. For example, in a case where the program allowable voltage is the ground voltage GND, the ground voltage GND may be applied to the lower are (−Z direction) of the first adjacent word line 1Adj_WL in the channel layer CHL of the selected cell string Sel_ST.

Therefore, the hot carrier injection may occur in the channel layer CHL due to a potential difference between an area in which the voltage is lowered by the ground voltage GND and an area in which the voltage is increased by the program voltage Vpgm. The program operation may be performed by moving electrons (e) of the channel layer CHL to the charge trap layer CTL corresponding to the selected memory cell due to the hot carrier injection.

Referring to FIG. 7B, since the program prohibit voltage Vinh is applied to the channel layer CHL of the unselected cell string Unsel_ST, boosting BT may occur in the channel layer CHL by the second and third pass voltages 2Vpass and 3Vpass and the program voltage Vpgm. In other words, the voltage of the channel layer CHL may increase due to the boosting BT. Accordingly, electrons are not trapped in the charge trap layer CTL (53) positioned between the selected word line Sel_WL and the first adjacent word line 1Adj_WL.

Figure 8:
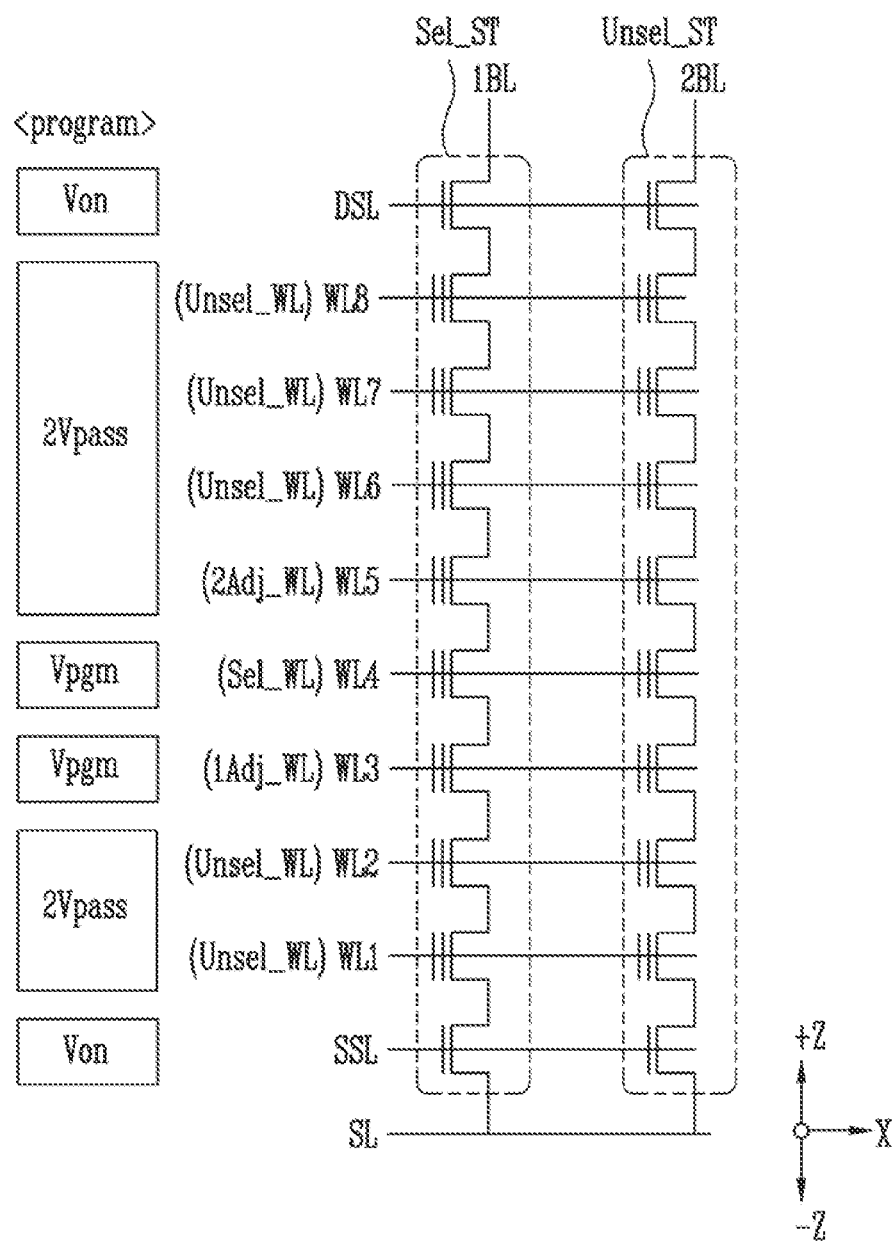
FIG. 8 is a circuit diagram illustrating a program operation in accordance with a third embodiment of the present disclosure.
Figure 9A:
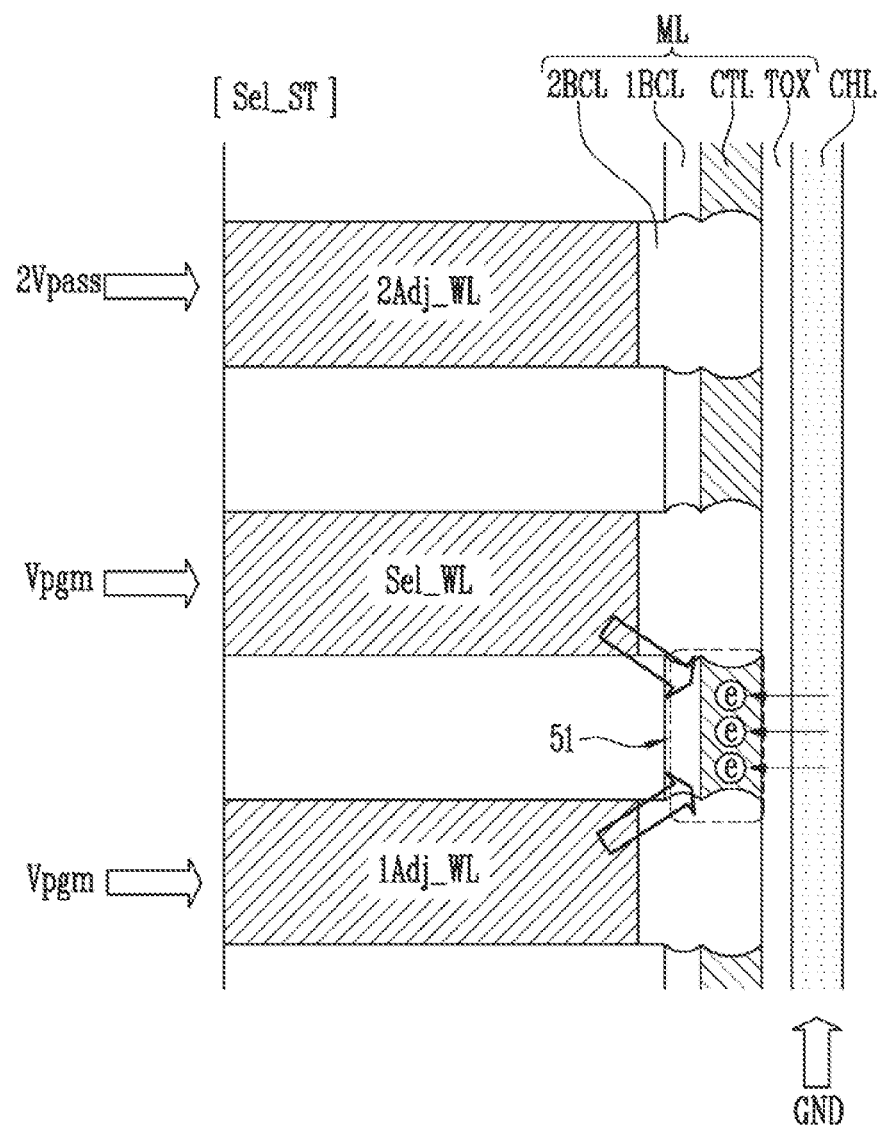
FIGS. 9A and 9B are diagrams illustrating the transfer of electrons during the program operation in accordance with the third embodiment of the present disclosure.
Figure 9B:
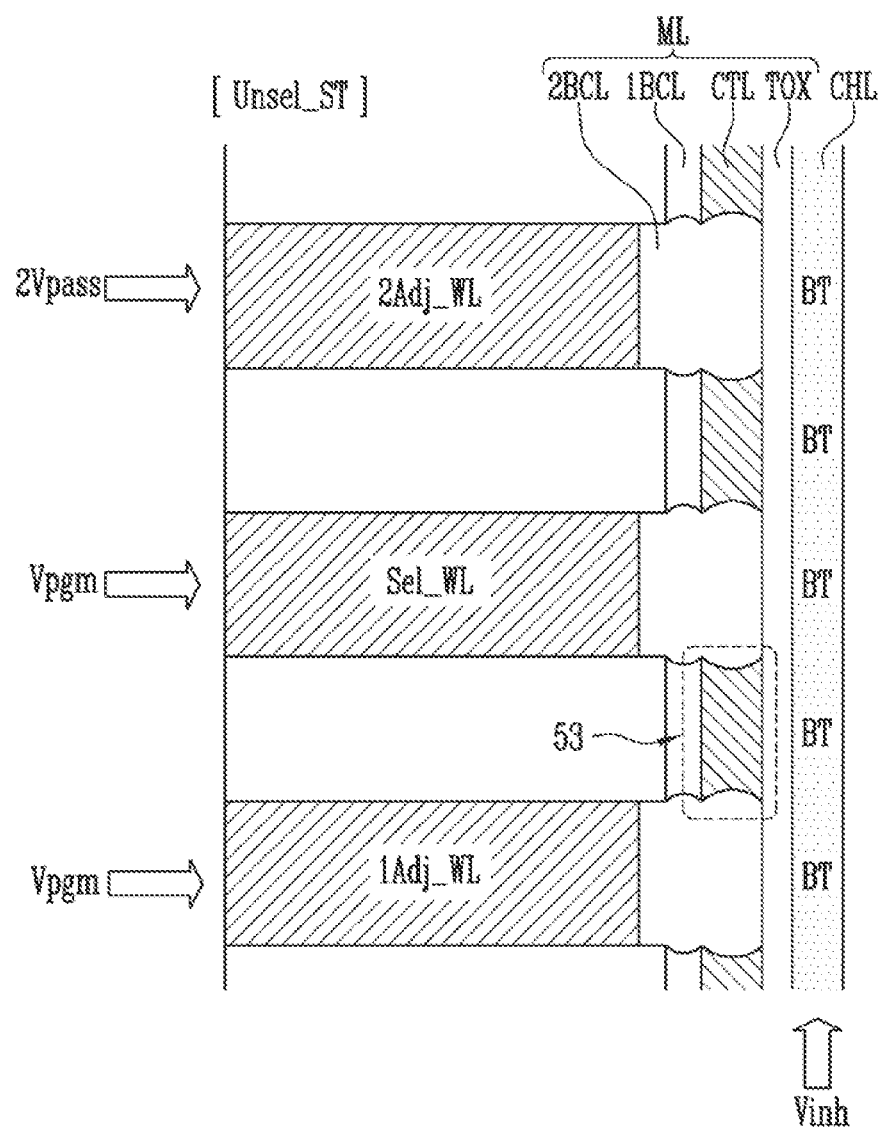

FIG. 8 is a circuit diagram illustrating a program operation in accordance with a third embodiment of the present disclosure, and FIGS. 9A and 9B are diagrams illustrating the transfer of electrons during the program operation in accordance with the third embodiment of the present disclosure.

Referring to FIG. 8, the program operation in accordance with the third embodiment may be performed using Fowler-Nordheim tunneling. During the program operation, a program voltage Vpgm having a positive voltage may be applied to the selected word line Sel_WL, and a program voltage Vpgm may be applied to the first adjacent word line 1Adj_WL adjacent to the lower portion of the selected word line Sel_WL. The second pass voltage 2Vpass may be applied to the second adjacent word line 2Adj_WL adjacent to the upper portion of the selected word line Sel_WL and the remaining unselected word lines Unsel_WL. Here, the first adjacent word line 1Adj_WL adjacent to the lower portion of the selected word line Sel_WL may be a word line adjacent to the selected word line Sel_WL in a −Z direction, and the second adjacent word line 2Adj_WL adjacent to the upper portion of the selected word line Sel_WL may be a word line adjacent to the selected word line Sel_WL in a +Z direction.

It is assumed that the cell string connected to a first bit line 1BL is a selected cell string Sel_ST, and the cell string connected to a second bit line 2BL is an unselected cell string Unsel_ST. A ground voltage GND may be applied to the source line SL and the first bit line 1BL, and a program inhibit voltage may be applied to the second bit line 2BL. A turn-on voltage Von having a positive voltage may be applied to the drain and source select lines DSL and SSL.

The selected cell string Sel_ST during the program operation will be described below with reference to FIG. 9A, and the unselected cell string Unsel_ST during the program operation will be described below with reference to FIG. 9B.

Referring to FIG. 9A, the ground voltage GND, which is a program allowable voltage, may be applied to the channel layer CHL of the selected cell string Sel_ST. The program voltage Vpgm may be applied to the selected word line Sel_WL and the first adjacent word line 1Adj_WL, and the second pass voltage 2Vpass may be applied to the second adjacent word line 2Adj_WL.

Since the charge trap layer CTL corresponding to the selected memory cell is positioned in an area between the selected word line Sel_WL and the first adjacent word line 1Adj_WL, a high voltage may be applied to word lines positioned above and below the selected memory cell so as to increase the threshold voltage of the selected memory cell. In other words, since the program voltage Vpgm is applied to the first adjacent word line 1Adj_WL, high coupling may occur due to the program voltage Vpgm applied to the selected word line Sel_WL and the program voltage Vpgm applied to the first adjacent word line 1Adj_WL. Thus, electrons (e) of the channel layer CHL to which the ground voltage GND is applied may move to the charge trap layer CTL (51) by FN tunneling.

Referring to FIG. 9B, since the program prohibit voltage Vinh is applied to the channel layer CHL of the unselected cell string Unsel_ST, boosting BT may occur in the channel layer CHL by the second pass voltage 2Vpass and the program voltage Vpgm. That is, the voltage of the channel layer CHL may be increased due to the boosting BT. Accordingly, since coupling does not occur in the charge trap layer CTL, electrons are not trapped in the charge trap layer CTL (53) positioned between the selected word line Sel_WL and the first adjacent word line 1Adj_WL.

Figure 10:
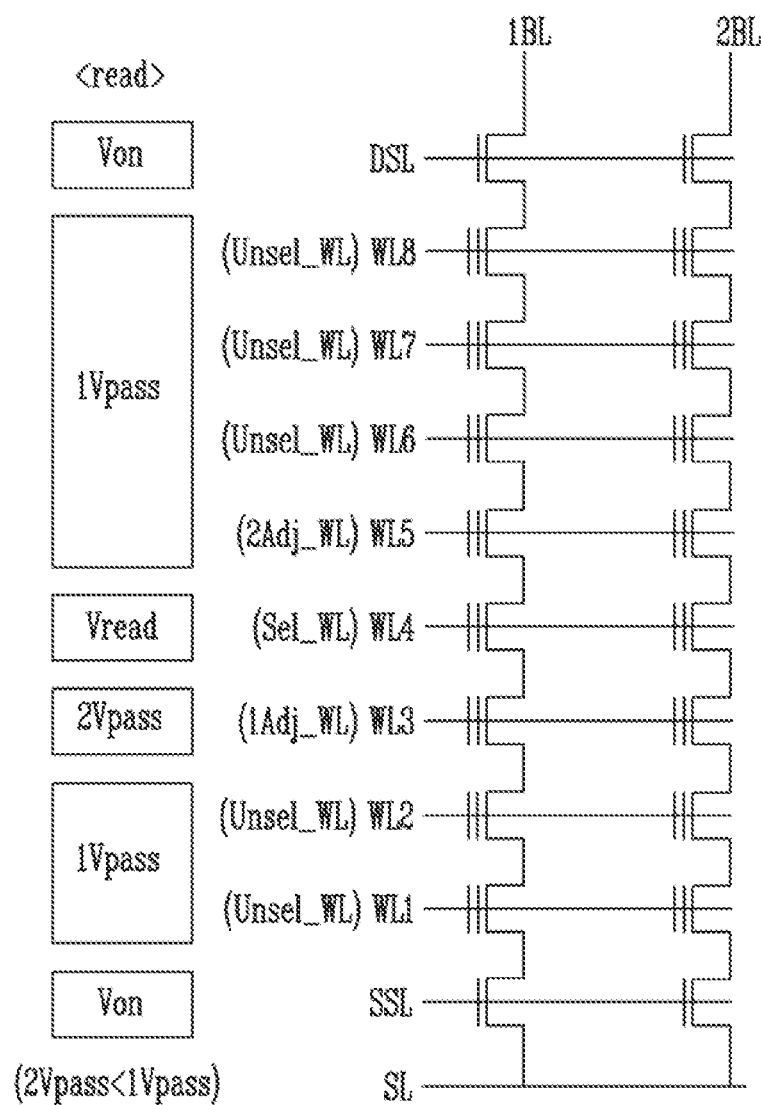
FIG. 10 is a circuit diagram illustrating a read operation in accordance with a fourth embodiment of the present disclosure.
Figure 11:
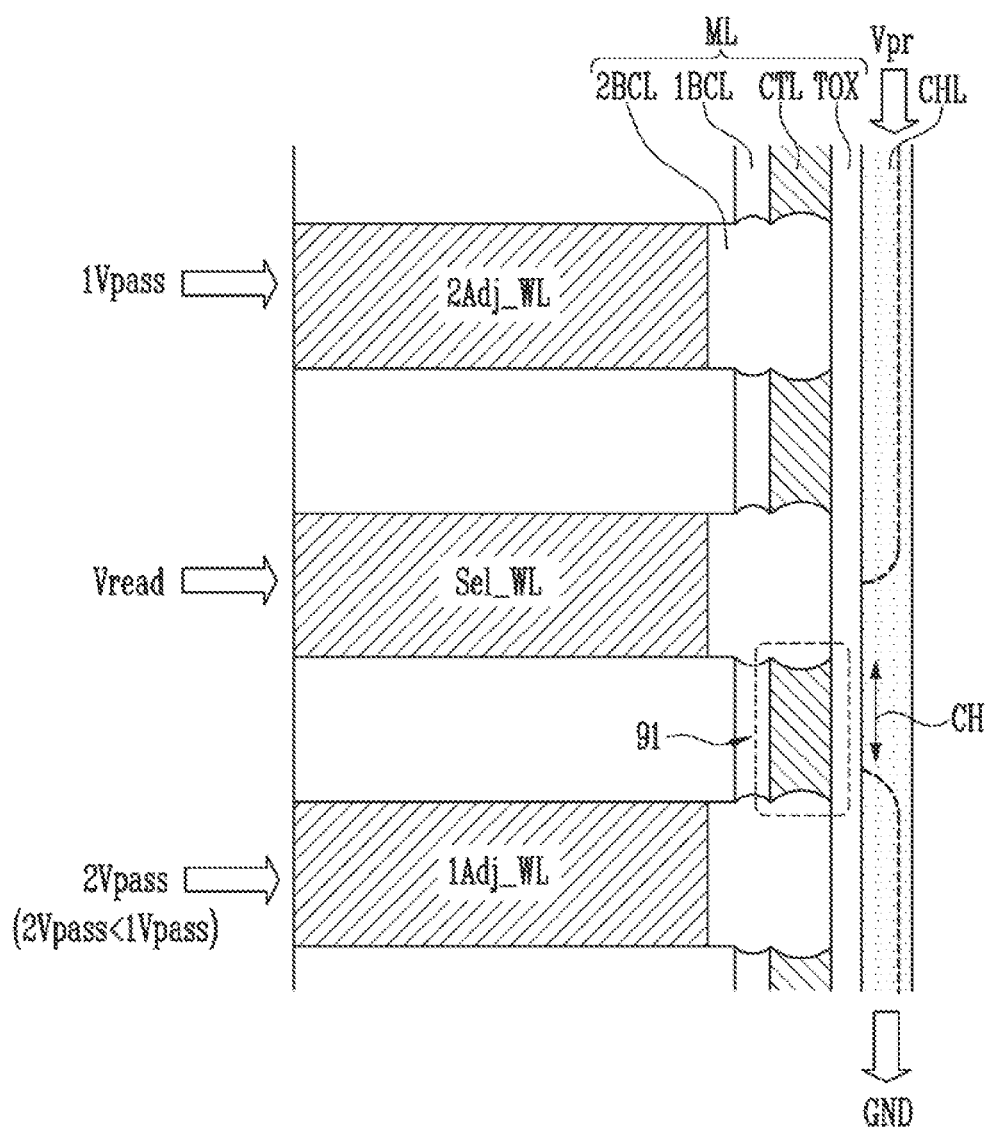
FIG. 11 is a diagram illustrating a channel of a memory cell selected during a read operation in accordance with the fourth embodiment of the present disclosure.

FIG. 10 is a circuit diagram illustrating a read operation in accordance with a fourth embodiment of the present disclosure, and FIG. 11 is a diagram illustrating a channel of a memory cell selected during a read operation in accordance with the fourth embodiment of the present disclosure.

Referring to FIG. 10, in the read operation according to the fourth embodiment, the read voltage Vread may be applied to the selected word line Sel_WL, and the second pass voltage 2Vpass may be applied to the first adjacent word line 1Adj_WL. To be more specific, a precharge voltage may be applied to the first and second bit lines 1BL and 2BL, and a ground voltage GND may be applied to the source line SL. A turn-on voltage Von may be applied to the drain and source select lines DSL and SSL. A read voltage Vread may be applied to the selected word line Sel_WL, and a second pass voltage 2Vpass lower than the first pass voltage 1Vpass may be applied to the first adjacent word line 1Adj_WL. The first pass voltage 1Vpass may be applied to the second adjacent word line 2Adj_WL and the remaining unselected word lines Unsel_WL. A principle in which the selected memory cell is read will be described as follows.

Referring to FIG. 11, when the threshold voltage of the selected memory cell 91 is lower than the read voltage Vread, the channel CH may be formed in the channel layer CHL adjacent to the selected memory cell 91. When the channel CH is formed, a channel CH electrically connecting the bit line and the source line is formed in the channel layer CHL, so the voltage of the bit line may be lowered. When the threshold voltage of the selected memory cell 91 is higher than the read voltage Vread, the channel CH is not formed in the channel layer CHL adjacent to the selected memory cell 91, so the bit line and the source line may be electrically disconnected in the channel layer CHL. Thus, the voltage of the bit line may be maintained at the precharge voltage.

Alternatively, when the threshold voltage of the selected memory cell 91 is lower than the read voltage Vread, the channel CH is formed in the channel layer CHL, so current may increase. When the threshold voltage of the selected memory cell 91 is higher than the read voltage Vread, the channel CH is blocked in the channel layer CHL, so current may decrease. Accordingly, data of the selected memory cell may be read according to the amount of current of the bit line.

Figure 12:
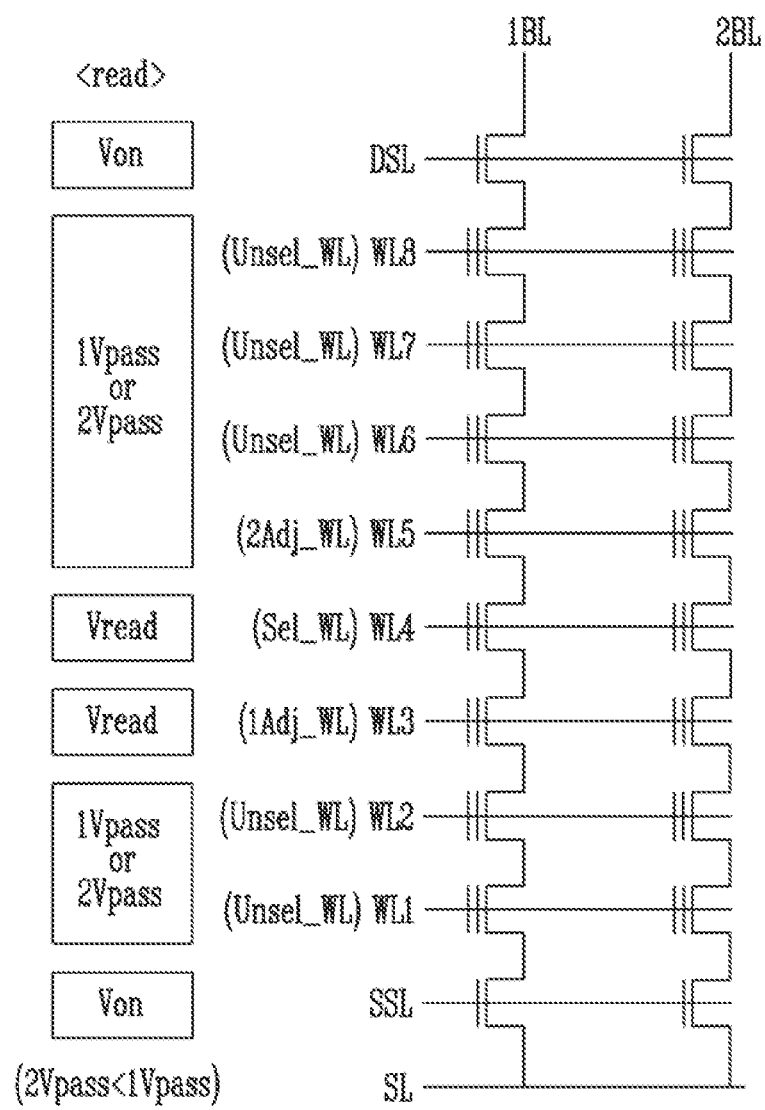
FIG. 12 is a circuit diagram illustrating a read operation in accordance with a fifth embodiment of the present disclosure.
Figure 13:
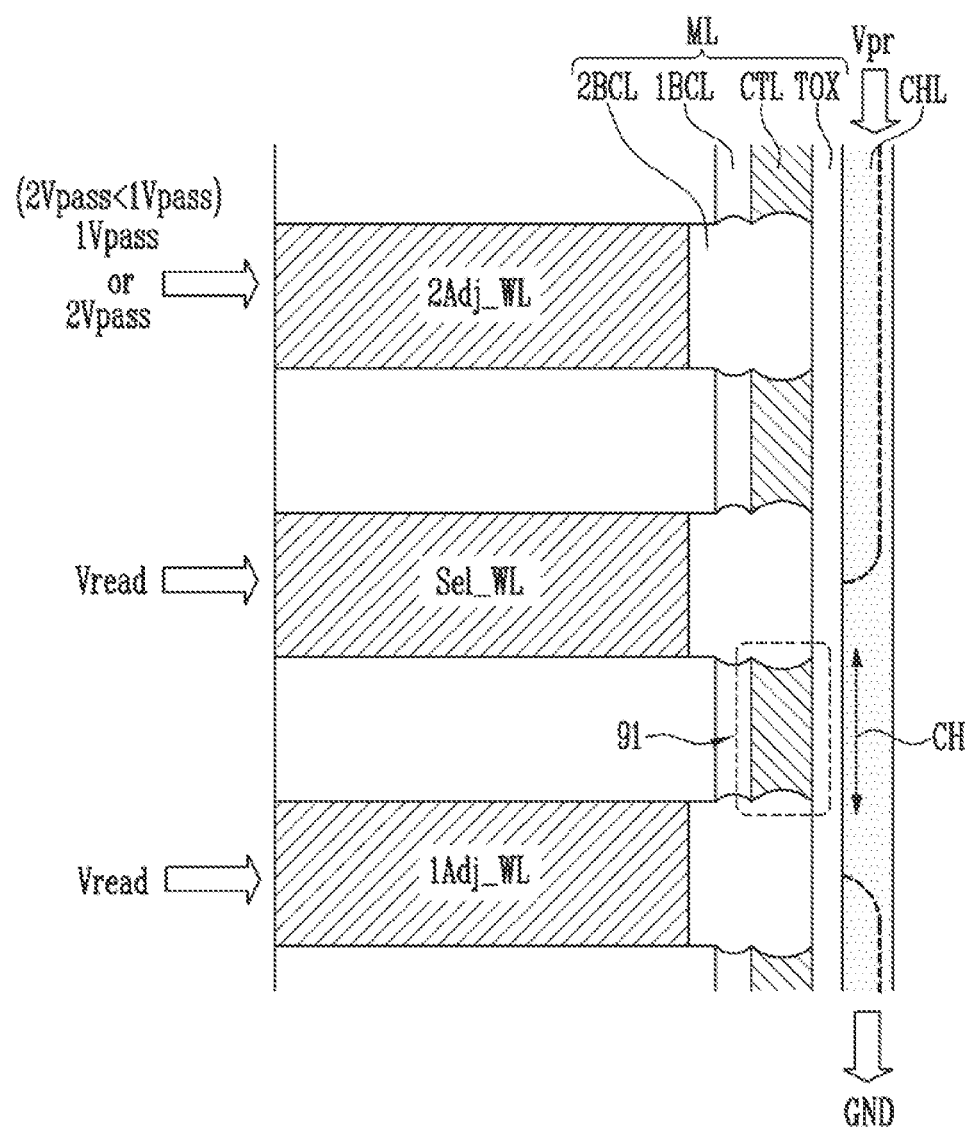
FIG. 13 is a diagram illustrating a channel of a memory cell selected during the read operation in accordance with the fifth embodiment of the present disclosure.

FIG. 12 is a circuit diagram illustrating a read operation in accordance with a fifth embodiment of the present disclosure, and FIG. 13 is a diagram illustrating a channel of a memory cell selected during the read operation in accordance with the fifth embodiment of the present disclosure.

Referring to FIG. 12, in the read operation according to the fourth fifth embodiment, the read voltage Vread may be applied to the selected word line Sel_WL and the first adjacent word line 1Adj_WL. To be more specific, a precharge voltage may be applied to the first and second bit lines 1BL and 2BL, and a ground voltage GND may be applied to the source line SL. A turn-on voltage Von may be applied to the drain and source select lines DSL and SSL. The read voltage Vread may be applied to the selected word line Sel_WL and the first adjacent word line 1Adj_WL, and the first pass voltage 1Vpass or the second pass voltage 2Vpass may be applied to the second adjacent word line 2Adj_WL and the remaining unselected word lines Unsel_WL. A principle in which the selected memory cell is read will be described as follows.

Referring to FIG. 13, when the threshold voltage of the selected memory cell 91 is lower than the read voltage Vread, the channel CH may be formed in the channel layer CHL adjacent to the selected memory cell 91. When the channel CH is formed, a channel CH electrically connecting the bit line and the source line is formed in the channel layer CHL, so the voltage of the bit line may be lowered. When the threshold voltage of the selected memory cell 91 is higher than the read voltage Vread, the channel CH is not formed in the channel layer CHL adjacent to the selected memory cell 91, so the bit line and the source line may be electrically disconnected in the channel layer CHL. Thus, the voltage of the bit line may be maintained at the precharge voltage.

Alternatively, when the threshold voltage of the selected memory cell 91 is lower than the read voltage Vread, the channel CH is formed in the channel layer CHL, so current may increase. When the threshold voltage of the selected memory cell 91 is higher than the read voltage Vread, the channel CH is blocked in the channel layer CHL, so current may decrease. Accordingly, data of the selected memory cell may be read according to the amount of current of the bit line.

Figure 14:
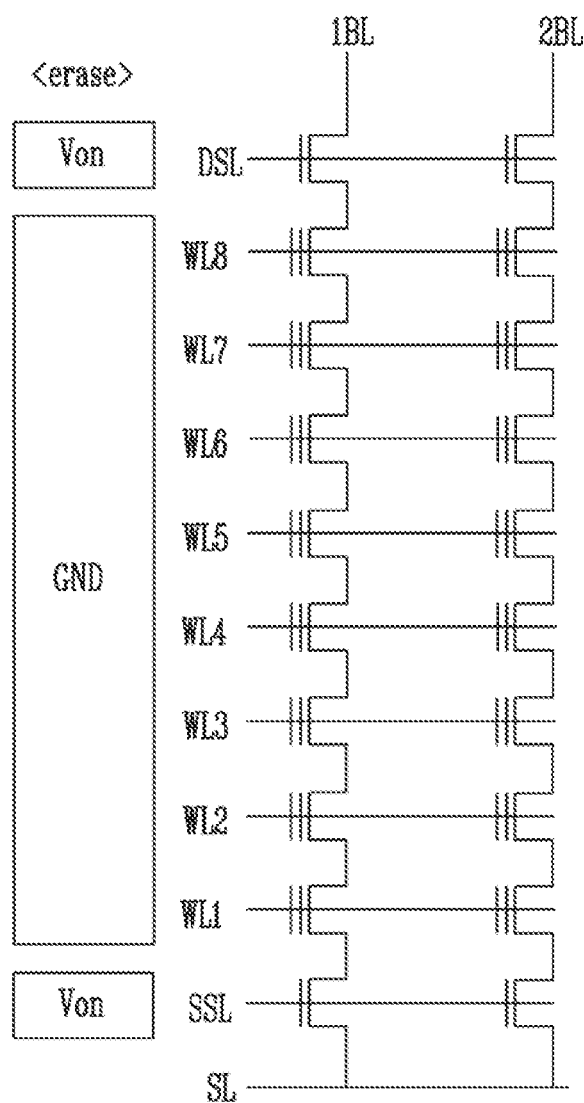
FIG. 14 is a circuit diagram illustrating an erase operation in accordance with a sixth embodiment of the present disclosure.
Figure 15:
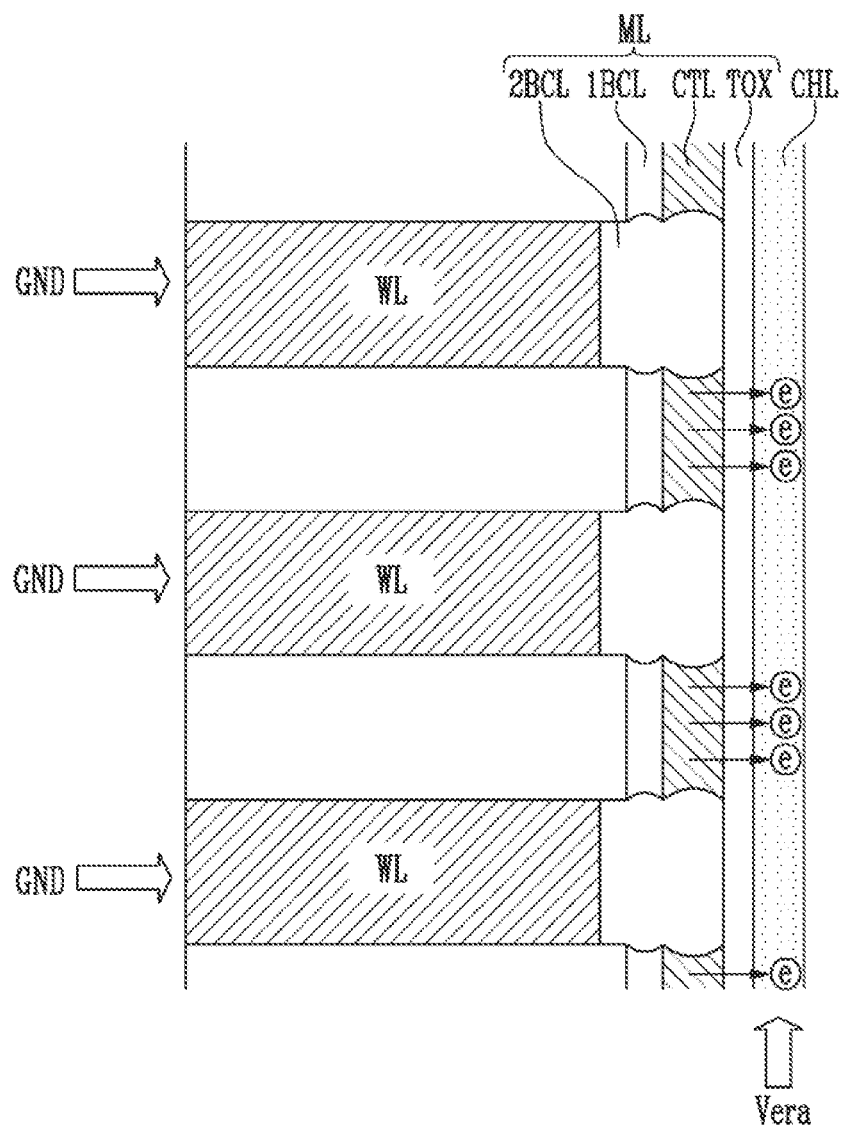
FIG. 15 is a diagram illustrating the transfer of electrons during the erase operation in accordance with the sixth embodiment of the present disclosure.

FIG. 14 is a circuit diagram illustrating an erase operation in accordance with a sixth embodiment of the present disclosure, and FIG. 15 is a diagram illustrating the transfer of electrons during the erase operation in accordance with the sixth embodiment of the present disclosure.

Referring to FIG. 14, during the erase operation, the ground voltage GND may be applied to all the word lines WL1 to WL8, and the turn-on voltage Von may be applied to the drain and source select lines DSL and SSL. When an erase voltage having a positive voltage is applied to the first and second bit lines 1BL and 2BL, the memory cells may be erased.

Referring to FIG. 15, when the erase voltage Vera having the positive voltage is applied to the channel layer CHL in a state where the ground voltage GND is to be applied to the word lines WL, electrons (e) trapped in the charge trap layer CTL may move to the channel layer CHL due to a voltage difference between the word lines WL and the channel layer CHL, thus performing an erase operation.

Figure 16A:
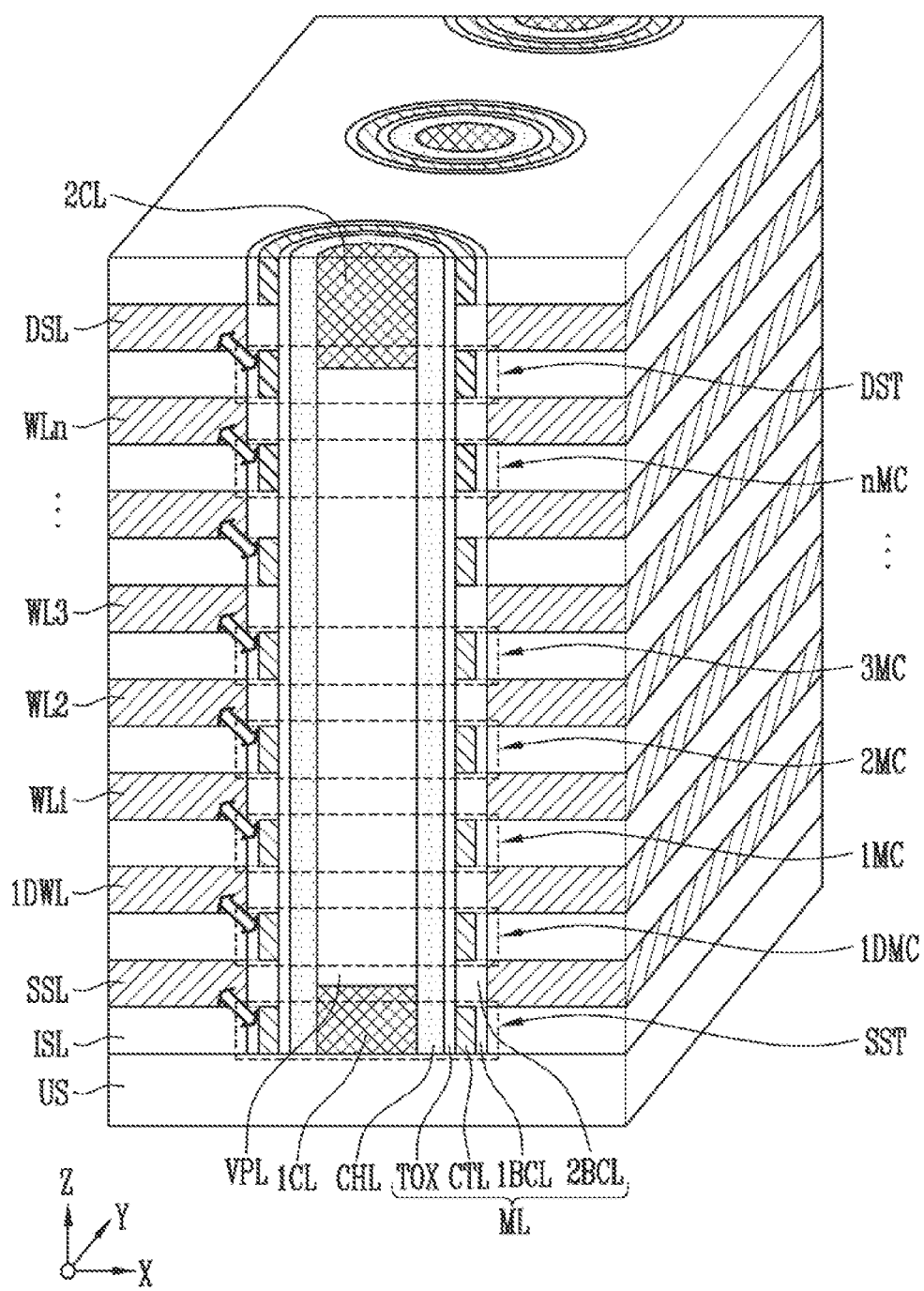
FIGS. 16A and 16B are perspective views illustrating the structure of a memory block in accordance with an embodiment of the present disclosure.
Figure 16B:
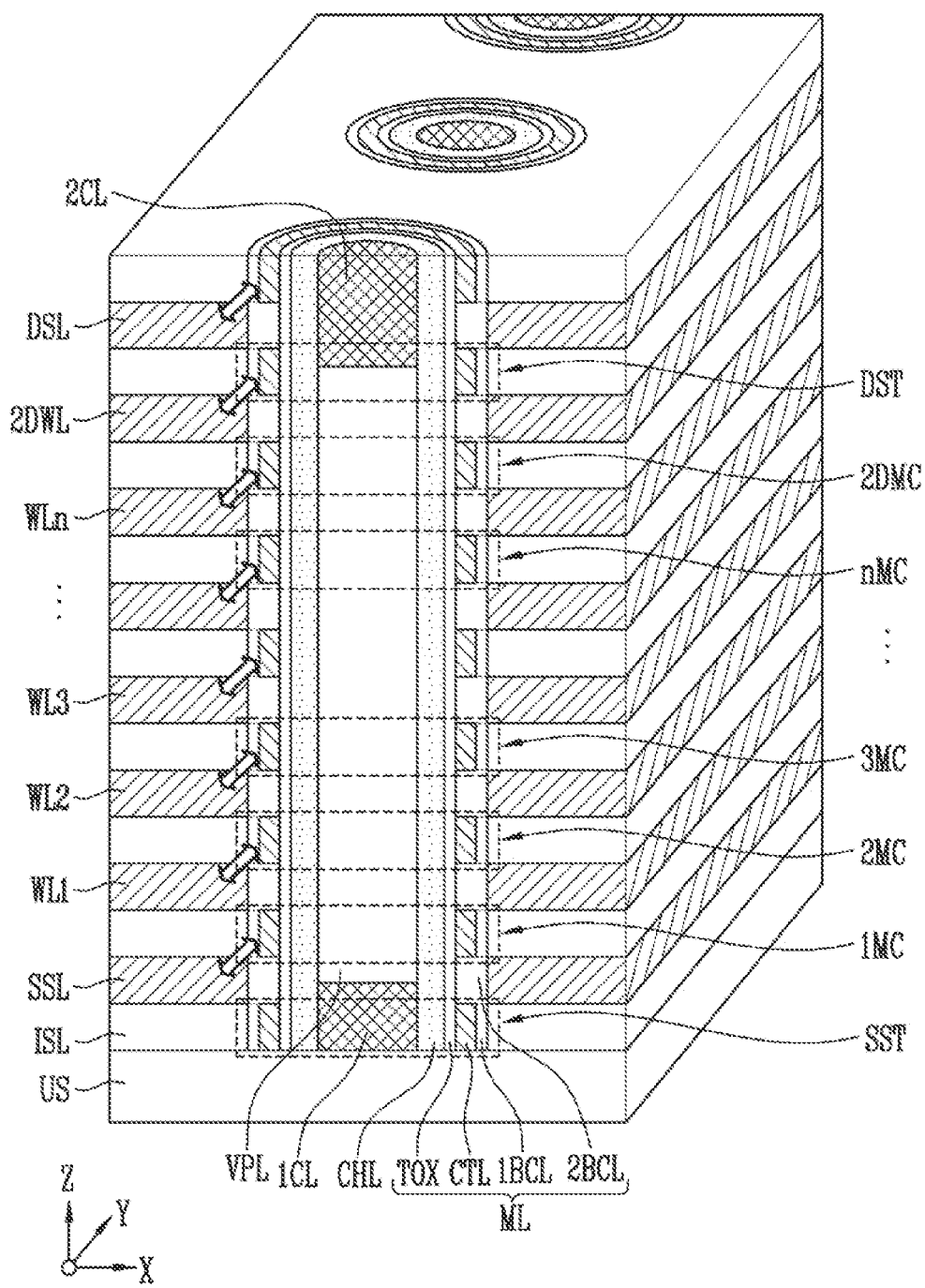

FIGS. 16A and 16B are perspective views illustrating the structure of a memory block in accordance with an embodiment of the present disclosure.

Referring to FIG. 16A, when the selected memory cell is set to be positioned in a layer lower than the selected word line as in the above-described embodiments, a first dummy line 1DWL may be formed between the source select line SSL and the first word line WL1. A first dummy cell 1DMC may be positioned in a layer between the first dummy line 1DWL and the source select line SSL. For example, a source select line SSL, a first dummy line 1DWL, first to n-th word lines WL1 to WLn, and a drain select line DSL may be sequentially stacked over an underlying structure US to be spaced apart from each other. A source select transistor SST, a first dummy cell 1DMC, first to n-th memory cells 1MC to nMC, and a drain select transistor DST may be sequentially stacked between the underlying structure US, the source select line SSL, the first dummy line 1DWL, the first to n-th word lines WL1 to WLn, and the drain select line DSL to be spaced apart from each other.

Referring to FIG. 16B, when the selected memory cell is set to be positioned in a layer higher than the selected word line unlike the above-described embodiments, a second dummy line 2DWL may be formed between the n-th word line WLn and the drain select line DSL. A second dummy cell 2DMC may be positioned in a layer between the second dummy line 2DWL and the drain select line DSL. For example, a source select line SSL, first to n-th word lines WL1 to WLn, a second dummy line 2DWL, and a drain select line DSL may be sequentially stacked over an underlying structure US to be spaced apart from each other. A source select transistor SST, first to n-th memory cells 1MC to nMC, a second dummy cell 2DMC, and a drain select transistor DST may be sequentially stacked between the source select line SSL, the first to n-th word lines WL1 to WLn, the second dummy line 2DWL, and the drain select line DSL to be spaced apart from each other.

In addition to the structures shown in FIGS. 16A and 16B, a plurality of dummy lines and a plurality of dummy cells may be formed in an area where the source select line SSL or the drain select line DSL is formed, and dummy lines and dummy cells may be formed in areas where the source select line SSL and the drain select line DSL are formed.

Figure 17:
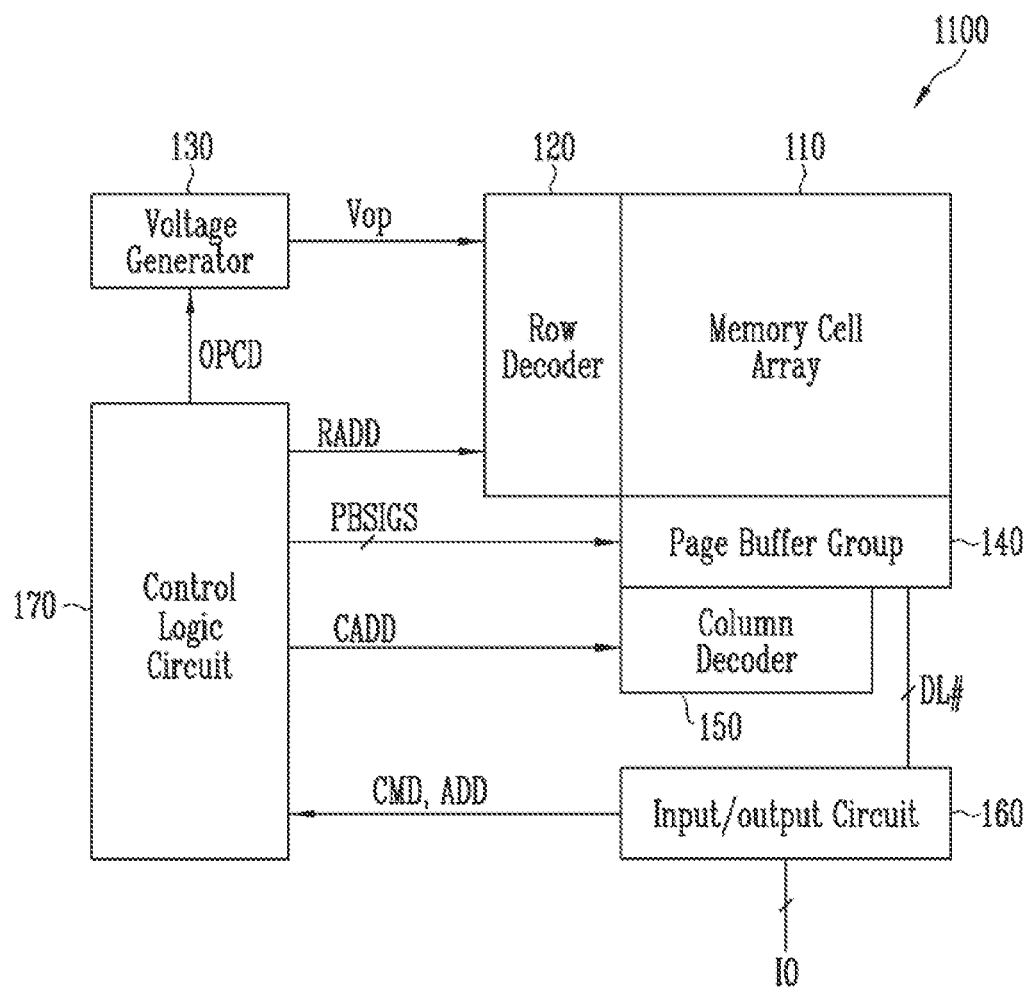
FIG. 17 is a block diagram illustrating a memory device including cell strings manufactured in accordance with an embodiment of the present disclosure.

FIG. 17 is a block diagram illustrating a memory device including cell strings manufactured in accordance with an embodiment of the present disclosure.

Referring to FIG. 17, a memory device 1100 may include a memory cell array 110 in which data is stored, and peripheral circuits 120 to 170 which may perform a program, read, or erase operation.

The memory cell array 110 may include a plurality of memory blocks in which data is stored. The memory blocks may include a plurality of cell strings, and the plurality of cell strings may have the structure according to the above-described embodiment.

The peripheral circuits 120 to 170 may include a row decoder 120, a voltage generator 130, a page buffer group 140, a column decoder 150, an input/output circuit 160, and a control logic circuit 170.

The row decoder 120 may select one memory block from among the memory blocks included in the memory cell array 110 according to a row address RADD, and may transmit operating voltages Vop to the selected memory block.

The voltage generator 130 may generate and output operating voltages Vop required for various operations in response to an operation code OPCD. For example, the voltage generator 130 may generate a program voltage, a read voltage, an erase voltage, a first pass voltage, a second pass voltage, and a verification voltage in response to the operation code OPCD, and may selectively output the generated voltages.

The page buffer group 140 may be connected to the memory cell array 110 through the bit lines. For example, the page buffer group 140 may include page buffers which are connected to the bit lines, respectively. The page buffers may be simultaneously operated in response to the page buffer control signals PBSIGS, and may temporarily store data in a program or read operation. The page buffers may sense the voltages of the bit lines that vary according to the threshold voltages of the memory cells in a read operation or a verification operation.

The column decoder 150 may transmit data through data lines DL which connect the input/output circuit 160 and the page buffer group 140 according to the column address CADD.

The input/output circuit 160 may be connected to an external device through input/output lines IO. Here, the external device may be a controller which may control the memory device. The input/output circuit 160 may input and output a command CMD, an address ADD, and data through the input/output lines IO. For example, the input/output circuit 160 may transmit the command CMD and the address ADD, received from the external device through the input/output lines IO, to the control logic circuit 170, and may transmit the data, received from the external device through the input/output lines IO, to the page buffer group 140. The input/output circuit 160 may output data, received from the page buffer group 140, to the external device through the input/output lines IO.

The control logic circuit 170 may output the operation code OPCD, the row address RADD, the page buffer control signals PBSIGS, and the column address CADD in response to the command CMD and the address ADD. For example, the control logic circuit 170 may include software configured to perform an algorithm in response to the command CMD, and hardware configured to output various signals according to the address ADD and the algorithm.

Figure 18:
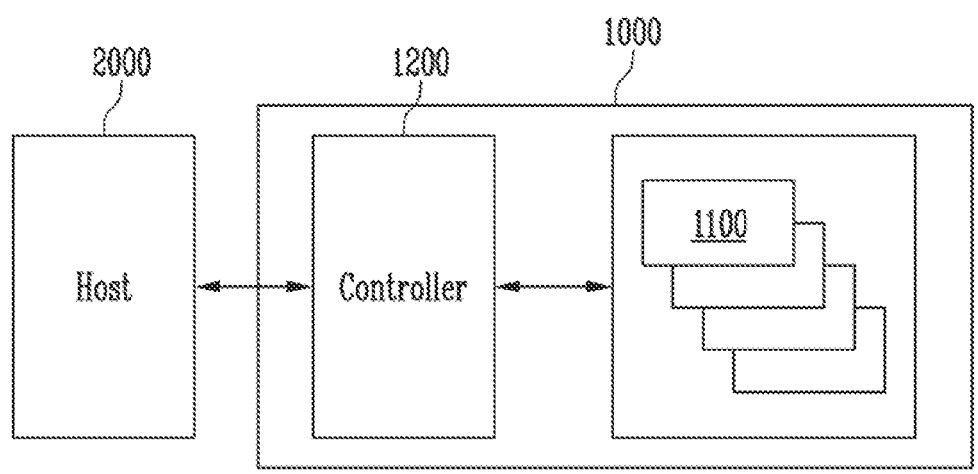
FIG. 18 is a block diagram illustrating an example of a memory system including a memory device in accordance with the present disclosure.

FIG. 18 is a block diagram illustrating an example of a memory system including a memory device in accordance with the present disclosure.

Referring to FIG. 18, a memory system 1000 may include a memory device 1100 configured to store data, and a controller 1200 configured to communicate between the memory device 1100 and a host 2000.

The memory device 1100 may be formed of the memory device 1100 illustrated in FIG. 17.

The memory system 1000 may include a plurality of memory devices 1100, and the memory devices 1100 may be connected to the controller 1200 through at least one channel. For example, the plurality of memory devices 1100 may be connected to one channel. Even when the plurality of channels is connected to the controller 1200, the plurality of memory devices 1100 may be connected to each channel.

The controller 1200 may communicate between the host 2000 and the memory devices 1100. The controller 1200 may control the memory devices 1100 in response to a request from the host 2000, or may perform a background operation for improving the performance of the memory system 1000 even when there is no request from the host 2000. The host 2000 may generate requests for various operations and output the generated requests to the memory system 1000. For example, the requests may include a program request for controlling a program operation, a read request for controlling a read operation, and an erase request for controlling an erase operation.

The host 2000 may communicate with the memory system 1000 through various interfaces such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

Figure 19:
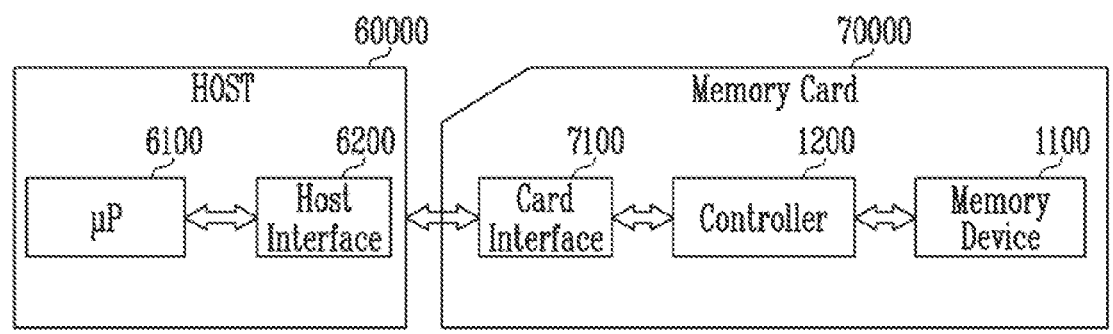
FIG. 19 is a block diagram illustrating an example of a memory system including a memory device in accordance with the present disclosure.

FIG. 19 is a block diagram illustrating an example of a memory system including a memory device in accordance with the present disclosure.

Referring to FIG. 19, a memory system 70000 may be embodied in a memory card or a smart card. The memory system 70000 may include a memory device 1100, a controller 1200, and a card interface 7100.

The memory device 1100 may be formed of the memory device 1100 illustrated in FIG. 17.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchanged between a host 60000 and the controller 1200 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under the control of a microprocessor (μP) 6100.

According to an embodiment of the present disclosure, an interference between memory cells formed on different layers can be suppressed.

What is claimed is:
1. A memory device comprising:
   interlayer insulating layers and conductive layers stacked alternately with each other;
   a vertical hole passing through the alternately stacked conductive layers and interlayer insulating layers;
   first blocking layers formed along the interlayer insulating layers exposed through the vertical hole;
   second blocking layers formed along the conductive layers exposed through the vertical hole, wherein each of the second blocking layers has a thickness greater than a thickness of each of the first blocking layers;
   charge trap layers formed on the same layer as the interlayer insulating layers, and surrounded by the first and second blocking layers, wherein the charge trap layers are separated from each other along a direction in which the first and second blocking layers are stacked;

a tunnel insulating layer formed along inner walls of the second blocking layers and the charge trap layers; and
a channel layer formed along an inner wall of the tunnel insulating layer, wherein the charge trap layers are not located on the same layer as the conductive layers; and
wherein layers that store data are not located on the same layer as the conductive layers.

2. The memory device according to claim 1, wherein:
each of the interlayer insulating layers and the tunnel insulating layer is formed of an oxide layer; and
each of the conductive layers is formed of at least one layer selected from among tungsten (W), cobalt (Co), nickel (Ni), molybdenum (Mo), silicon (Si), and polysilicon (poly-Si).

3. The memory device according to claim 1, wherein each of the first and second blocking layers is formed of an oxide layer.

4. The memory device according to claim 1, wherein each of the charge trap layers is formed of a nitride layer.

5. The memory device according to claim 1, wherein the charge trap layers and the first blocking layers are formed between the second blocking layers formed on different layers.

6. The memory device according to claim 1, wherein:
each of the first blocking layers is formed to have a first thickness; and
each of the charge trap layers is formed to have a second thickness.

7. The memory device according to claim 6, wherein:
the first thickness is a thickness from an inner wall of each of the interlayer insulating layers to an inner wall of the first blocking layers;
the second thickness is a thickness from the inner wall of each of the first blocking layers to the inner wall of each of the charge trap layers.

8. The memory device according to claim 6, wherein each of the second blocking layers is formed to have a thickness that is equal to a sum of the first thickness and the second thickness.

9. The memory device according to claim 6, wherein each of the second blocking layers is formed to have a thickness that is greater than a sum of the first thickness and the second thickness.

10. The memory device according to claim 1, wherein the second blocking layers are formed between the conductive layers and the tunnel insulating layer.

11. The memory device according to claim 1, wherein the first blocking layers and the charge trap layers are formed between the interlayer insulating layers and the tunnel insulating layer.

12. A memory device comprising:
interlayer insulating layers and word lines stacked alternately with each other;
a memory layer configured to pass vertically through the alternately stacked word lines and interlayer insulating layers; and
a channel layer formed along an inner wall of the memory layer,
wherein the memory layer comprises charge trap layers located on the same layer as the interlayer insulating layers, wherein the charge trap layers are not located on the same layer as the word lines; and
wherein layers that store data are not located on the same layer as the word lines.

13. The memory device according to claim 12, wherein the memory layer comprises:
first blocking layers and the charge trap layers formed between the interlayer insulating layers and a tunnel insulating layer; and
second blocking layers formed between the word lines and the tunnel insulating layer.

14. The memory device according to claim 13, wherein:
the first blocking layers are formed between the interlayer insulating layers and the charge trap layers; and
the charge trap layers are formed between the first blocking layers and the tunnel insulating layer.

15. The memory device according to claim 13, wherein each of the charge trap layers is formed in a ring shape on the same layer as a layer on which each of the interlayer insulating layers is formed.

16. The memory device according to claim 13, wherein the charge trap layers formed on different layers are electrically blocked from each other by the second blocking layers.

17. The memory device according to claim 12, wherein the charge trap layers formed on lower layers of the word lines are used as memory cells corresponding to the word lines, respectively.

18. The memory device according to claim 12, further comprising:
a first select line formed in a lower portion of a structure including the interlayer insulating layers and the word lines; and
a second select line formed in an upper portion of the structure including the interlayer insulating layers and the word lines.

19. The memory device according to claim 18, further comprising:
a vertical pillar formed in an empty space of the channel layer.

20. The memory device according to claim 19, further comprising:
a first conductive layer formed from a lower portion of the vertical pillar to a height at which the first select line is formed; and
a second conductive layer formed from an upper portion of the vertical pillar to a height at which the second select line is formed.

* * * * *